(12) United States Patent
Hossain et al.

(10) Patent No.: US 10,734,971 B2
(45) Date of Patent: Aug. 4, 2020

(54) NOISE REDUCING RECEIVER

(71) Applicant: Rambus Inc., Sunnyvale, CA (US)

(72) Inventors: Masum Hossain, Edmonton (CA); Carl W. Werner, Los Gatos, CA (US)

(73) Assignee: Rambus Inc., San Jose, CA (US)

(*) Notice: Subject to any disclaimer, the term of this patent is extended or adjusted under 35 U.S.C. 154(b) by 0 days.

(21) Appl. No.: 16/276,677

(22) Filed: Feb. 15, 2019

(65) Prior Publication Data
US 2019/0260356 A1 Aug. 22, 2019

Related U.S. Application Data

(60) Provisional application No. 62/632,930, filed on Feb. 20, 2018.

(51) Int. Cl.
*H03H 11/12* (2006.01)
*H04B 1/04* (2006.01)
*H04B 1/58* (2006.01)
*H04B 1/10* (2006.01)

(52) U.S. Cl.
CPC ....... *H03H 11/1239* (2013.01); *H04B 1/0458* (2013.01); *H04B 1/109* (2013.01); *H04B 1/588* (2013.01); *H04B 2001/045* (2013.01)

(58) Field of Classification Search
CPC .. H03H 11/1239; H04B 1/0458; H04B 1/109; H04B 1/588
See application file for complete search history.

(56) References Cited

U.S. PATENT DOCUMENTS

| | | | |
|---|---|---|---|
| 5,416,483 A * | 5/1995 | Matsuya | H04B 14/046 341/143 |
| 6,570,919 B1 | 5/2003 | Lee | |
| 7,027,503 B2 | 4/2006 | Smee et al. | |
| 7,539,243 B1 | 5/2009 | Toif et al. | |
| 7,636,408 B2 | 12/2009 | Bau et al. | |
| 7,656,977 B2 | 2/2010 | Singh | |
| 7,809,054 B2 | 10/2010 | Carballo et al. | |
| 7,817,714 B2 * | 10/2010 | Bae | H04L 25/03057 375/229 |

(Continued)

OTHER PUBLICATIONS

A. V. Rylyakov et at. , "A new ultra-high sensitivity, low-power optical receiver based en a decision-feedback equalizer," IBM T.J Research Center, Yorktown, Heights, NY, Optical Society of America OSA/OFC/NFOEC, OThP3.pdf, 2011. 3 Pages.

*Primary Examiner* — Nguyen T Vo
(74) *Attorney, Agent, or Firm* — The Neudeck Law Firm, LLC

(57) ABSTRACT

Disclosed is receiver for a noise limited system. A front-end circuit amplifies and band-limits an incoming signal. The amplification increases the signal swing but introduces both thermal and flicker noise. A low-pass band limitation reduces the thermal noise component present at frequencies above what is necessary for correctly receiving the transmitted symbols. This band limited signal is provided to the integrator circuit. The output of the integrator is equalized to reduce the effects of inter-symbol interference and then sampled. The samples are used to apply low frequency equalization (i.e., in response to long and/or unbalanced strings of symbols) to mitigate the effects of DC wander caused by mismatches between the number of symbols of each kind being received.

14 Claims, 19 Drawing Sheets

(56) References Cited

U.S. PATENT DOCUMENTS

| | | |
|---|---|---|
| 8,310,309 B2 | 11/2012 | Behera et al. |
| 8,848,774 B2 | 9/2014 | Zhong et al. |
| 8,917,762 B2 | 12/2014 | Francese et al. |
| 8,976,855 B2 | 3/2015 | Xu et al. |
| 2015/0010047 A1 | 1/2015 | Zhong et al. |
| 2017/0019275 A1 | 1/2017 | Norimatsu |

\* cited by examiner

NOISE REDUCING RECEIVER

DETAILED DESCRIPTION OF THE EMBODIMENTS

Some signaling systems for communicating information use very small voltage and/or current swings. In these systems, noise generated by the circuitry for sensing (i.e., receiving) symbols may limit the performance of the system. This may be referred to as a 'noise limited' system. For example, the noise behavior of bulk CMOS devices is, at most operating temperatures, dominated by two noise sources: thermal noise and flicker (1/f) noise. Thermal noise is the voltage fluctuations caused by the random Brownian motion of electrons in a resistive medium. Thermal noise has the characteristics of broadband white noise, and increases with increasing resistance and increasing temperature. Flicker noise is greatest at low frequencies. Flicker noise may be called 1/f noise because its power spectrum approximates the shape of a plot of the formula $P(f)=P_0/f$.

In an embodiment, a front-end circuit amplifies and band-limits (e.g., with a high-pass and/or bandpass filter) an incoming signal. The amplification increases the signal swing but introduces both thermal and flicker noise. A high-pass band limitation reduces or effectively eliminates the amount of 1/f noise (and thermal noise) presented to an integrator circuit by reducing the lower frequency noise components where the 1/f noise predominates. A low-pass band limitation reduces the thermal noise component present at frequencies above what is necessary for correctly receiving the transmitted symbols. This band limited signal is provided to the integrator circuit. Since the thermal noise is random and centered around the signal, integrating reduces or effectively eliminates noise caused by random thermal noise perturbations. Integration removes random noise perturbations because, over the integration period (e.g., symbol time) some noise perturbations will be canceled by other noise perturbations that occur at other times during the integration period.

However, reducing the bandwidth of a signal (e.g., by a high-pass filtering effect) introduces inter-symbol interference (ISI). Removing the lower frequencies from the signal can, for long strings of the same symbol, introduce baseline wander (a.k.a., DC wander.) These long strings may also be referred to as consecutive identical digits or consecutive identical data (CID). For example, even a random data signal may, from time-to-time, produce long runs of consecutive identical data. The output of the integrator is equalized (e.g., using decision feedback equalization techniques—DFE) to reduce the effects of ISI. The output of the equalization is resolved into symbols by a sampler. The symbols output by the sampler are used to apply the equalization (if any) to the next received symbol. The symbols output by the sampler are also used to apply low frequency equalization (i.e., in response to long and/or unbalanced strings of symbols) to mitigate the effects of DC wander caused by mismatches between the number of symbols of each kind being received.

Figure 1A:
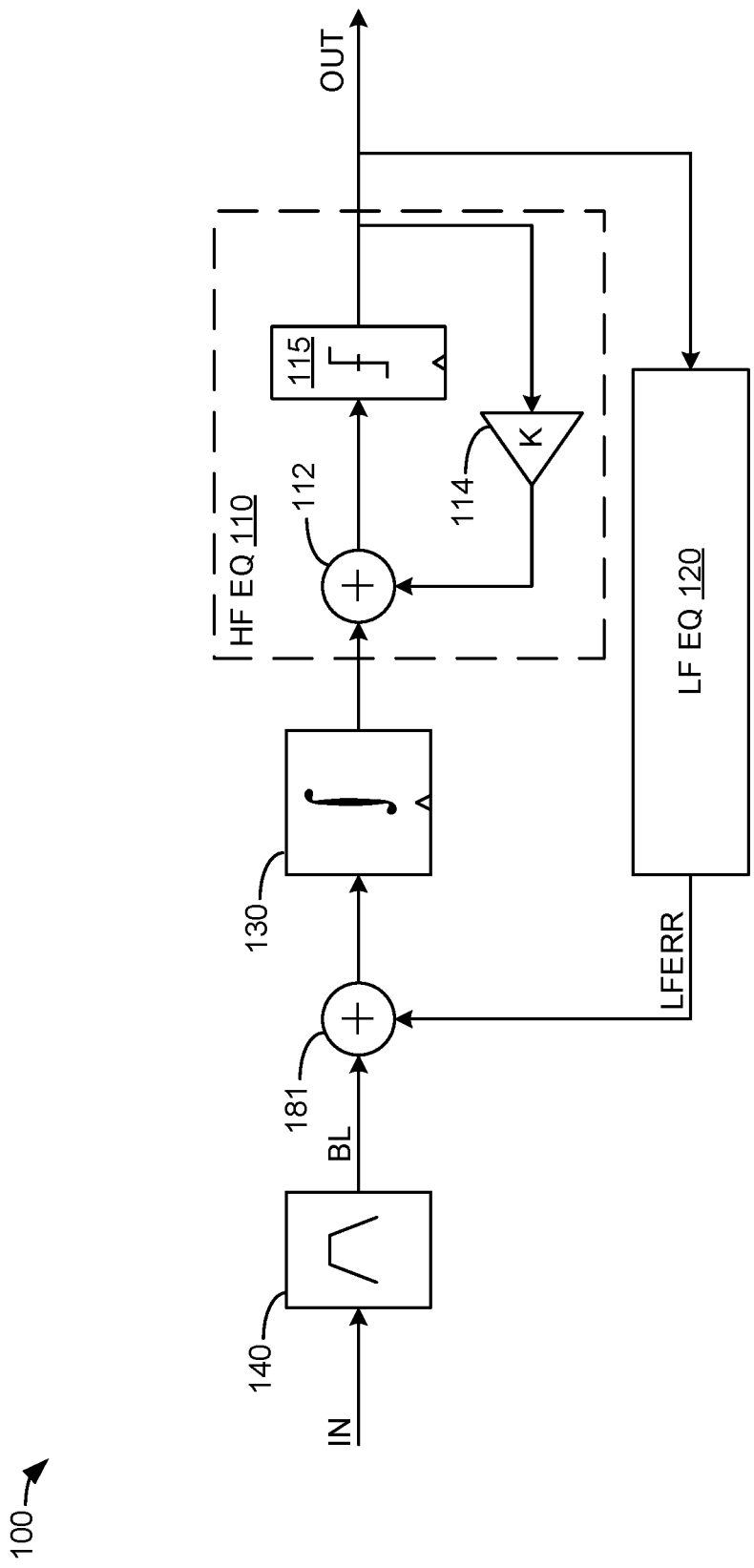
FIG. 1A is a block diagram illustrating an integrating receiver.

FIG. 1A is a block diagram illustrating an integrating receiver. In FIG. 1, receiver 100 comprises high-frequency equalizer (HF EQ) 110, low-frequency equalizer (LF EQ) 120, summer 181, integrator circuit 130, and front-end 140. High-frequency equalizer 110 includes summer 112, buffer 114, and sampler 115.

An input signal (IN) is provided to front-end 140. Front-end 140 may comprise one or more amplifier stages (e.g., a low noise amplifier—LNA, a variable gain stage—VGA, and/or a programmable gain stage—PGA), one or more filters, or both. Front-end 140 outputs a band limited signal, BL. The band limitations of signal BL may be a result of one or more of the amplification characteristics (e.g., amplification bandwidth, cutoff frequencies, etc.) of the amplifier(s), filter circuits within front-end 140, and/or the channel that the input signal has traversed.

The bandwidth limited signal (BL) output by front-end 140 is provided to a first input to summer 181. Summer 181 receives, at a second input, an error correction signal (LFERR) from low-frequency equalizer 120. The error correction signal from low-frequency equalizer 120 reduces or effectively eliminates low-frequency offsets (errors) caused by long and/or unbalanced (relative to the lower cutoff frequency of front-end 140) strings of one type of symbol versus another. The output of summer 181 is provided to integrator 130.

Integrator 130 integrates the signal from summer 181 over a period of time (e.g., symbol time or partial symbol time) and provides its output to high-frequency equalizer 110. High-frequency equalizer 110 applies equalization to the output of integrator 130 based on the symbol sampled by sampler 115 from the immediately preceding symbol time.

The output of integrator 130 is provided to a first input to summer 112. Summer 112 receives, at a second input, an equalization signal from buffer 114. The output of summer 112 is provided to sampler 115. The output of sampler 115 (OUT) indicates the symbol that is received. The output of sampler 115 is fed-back via buffer 114 to the second input of summer 112. This feedback path weights the sampler output by K and adds this weighted amount to the input signal provided to sampler 115. When K is selected to be a negative value, the amount K*(current output of sampler 115) is subtracted from the input signal to sampler 115 that will be present when the next symbol is sampled. Thus, it should be understood that high-frequency equalizer 110 is operates on the current symbol to remove ISI caused by the immediately preceding symbol's value (or more—e.g., 2, 3, 4, 10, 20, etc. unit intervals.) The output of sampler 115 (OUT) is also the output of receiver 100.

Figure 1B:
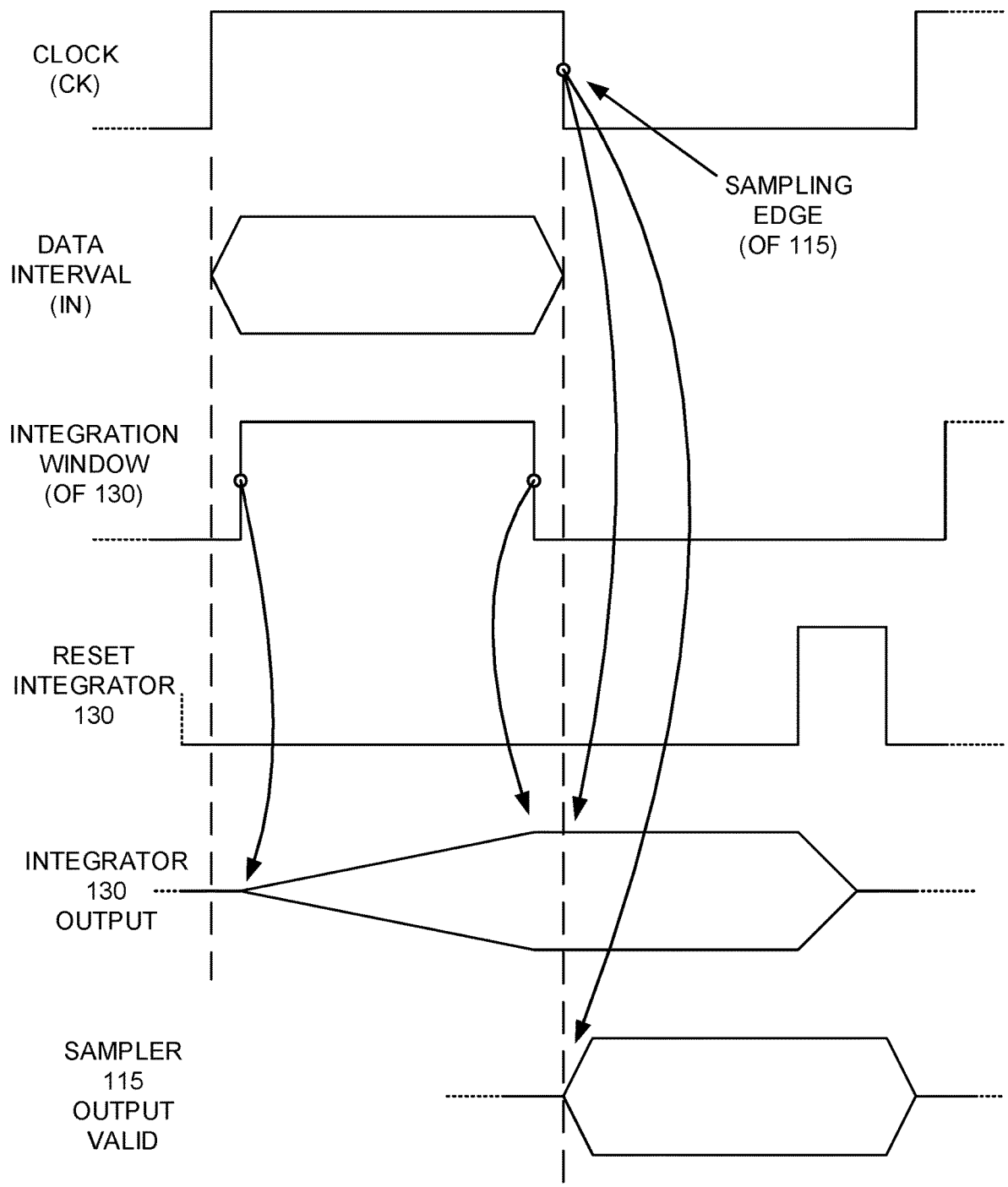
FIG. 1B is an example timing diagram illustrating the operation of an integrating receiver.

The output of sampler 115 (OUT) is also input to low-frequency equalizer 120. Low-frequency equalizer 120 operates to compensate for baseline wander on the output of front-end 140 (BL) caused by unbalanced numbers of symbols being received at the input, IN. For example, when front-end 140 has a low-frequency (and/or DC) band rejection effect, a long string of CID has a frequency spectrum that is significantly blocked by this band-blocking characteristic. Low-frequency equalizer 120 is configured to receive the output of sampler 115 and (at least partially) compensate for the blocked low-frequency components of the input signal (IN). Examples of circuits and techniques that can be used as low-frequency equalizer 120 are described herein with reference to one or more of FIG. 3-5, and LF EQ circuits 320, 420, and/or 520. FIG. 1B is an example timing diagram illustrating the operation of integrating receiver 100.

Figure 2A:
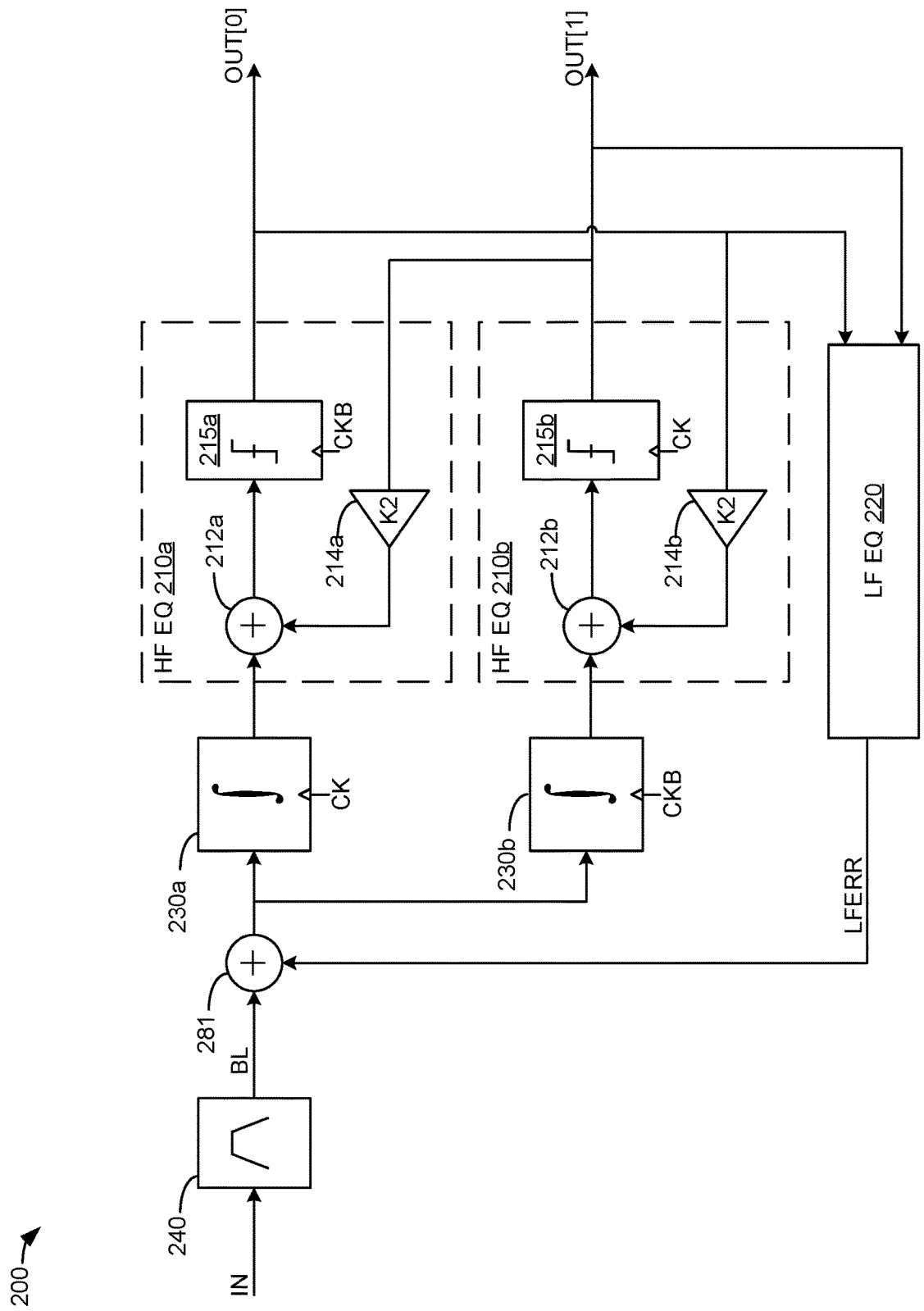
FIG. 2A is a block diagram illustrating a half rate integrating receiver.

FIG. 2A is a block diagram illustrating a half rate receiver. In FIG. 2A, receiver 200 comprises high-frequency equalizer (HF EQ) 210a, HF EQ 210b, low-frequency equalizer (LF EQ) 220, summer 281, integrator circuit 230a, integrator circuit 230b, and front-end 240. High-frequency equalizer 210a includes summer 212a, buffer 214a, and sampler 215a. High-frequency equalizer 210b includes summer 212b, buffer 214b, and sampler 215b.

An input signal (IN) is provided to front-end 240. Front-end 240 may comprise one or more amplifier stages (e.g., a low noise amplifier—LNA), one or more filters, or both. Front-end 240 outputs a band limited signal, BL. The band limitations of signal BL may be a result of one or more of the amplification characteristics (e.g., amplification bandwidth, cutoff frequencies, etc.) of the amplifier(s), filter circuits within front-end 240, and/or the channel that the input signal has traversed.

The bandwidth limited signal (BL) output by front-end 240 is provided to a first input to summer 281. Summer 281 receives, at a second input, an error correction signal (LFERR) from low-frequency equalizer 220. The error correction signal from low-frequency equalizer 220 reduces or effectively eliminates caused by long (relative to the lower cutoff frequency of front-end 240) strings of one type of symbol versus another. The output of summer 281 is provided to integrator 230a and integrator 230b.

Integrators 230a and 230b integrate the signal from summer 281 over alternating periods of time (e.g., alternating successive symbol times) and provides their respective outputs to high-frequency equalizer 210a and high-frequency equalize 210b, respectively. High-frequency equalizer 210a applies equalization to the output of integrator 230a based on the symbol sampled by sampler 215b corresponding to the immediately preceding symbol time. High-frequency equalizer 210b applies equalization to the output of integrator 230b based on the symbol sampled by sampler 215a corresponding to the immediately preceding symbol time.

The output of integrator 230a is provided to a first input to summer 212a. Summer 212a receives, at a second input, an equalization signal from buffer 214a. The output of summer 212a is provided to sampler 215a. The output of sampler 215a indicates the symbol that is received during the symbol time that integrator 230a integrated over. The output of sampler 215a is provided, via buffer 214b, to an input of summer 212b. Thus, it should be understood that high-frequency equalizer 210a operates on the current symbol to remove ISI caused by the previous symbol's value as determined by sampler 215b. The output of sampler 215a is the even cycle output of receiver 200 (OUT[0]).

The output of integrator 230b is provided to a first input to summer 212b. Summer 212b receives, at a second input, an equalization signal from buffer 214b. The output of summer 212b is provided to sampler 215b. The output of sampler 215b indicates the symbol that is received during the symbol time that integrator 230b integrated over. The output of sampler 215b is provided, via buffer 214a, to an input of summer 212a. Thus, it should be understood that high-frequency equalizer 210b operates on the current symbol to remove ISI caused by the previous symbol's value as determined by sampler 215a. The output of sampler 215b is the odd cycle output of receiver 200 (OUT[1]).

Figure 2B:
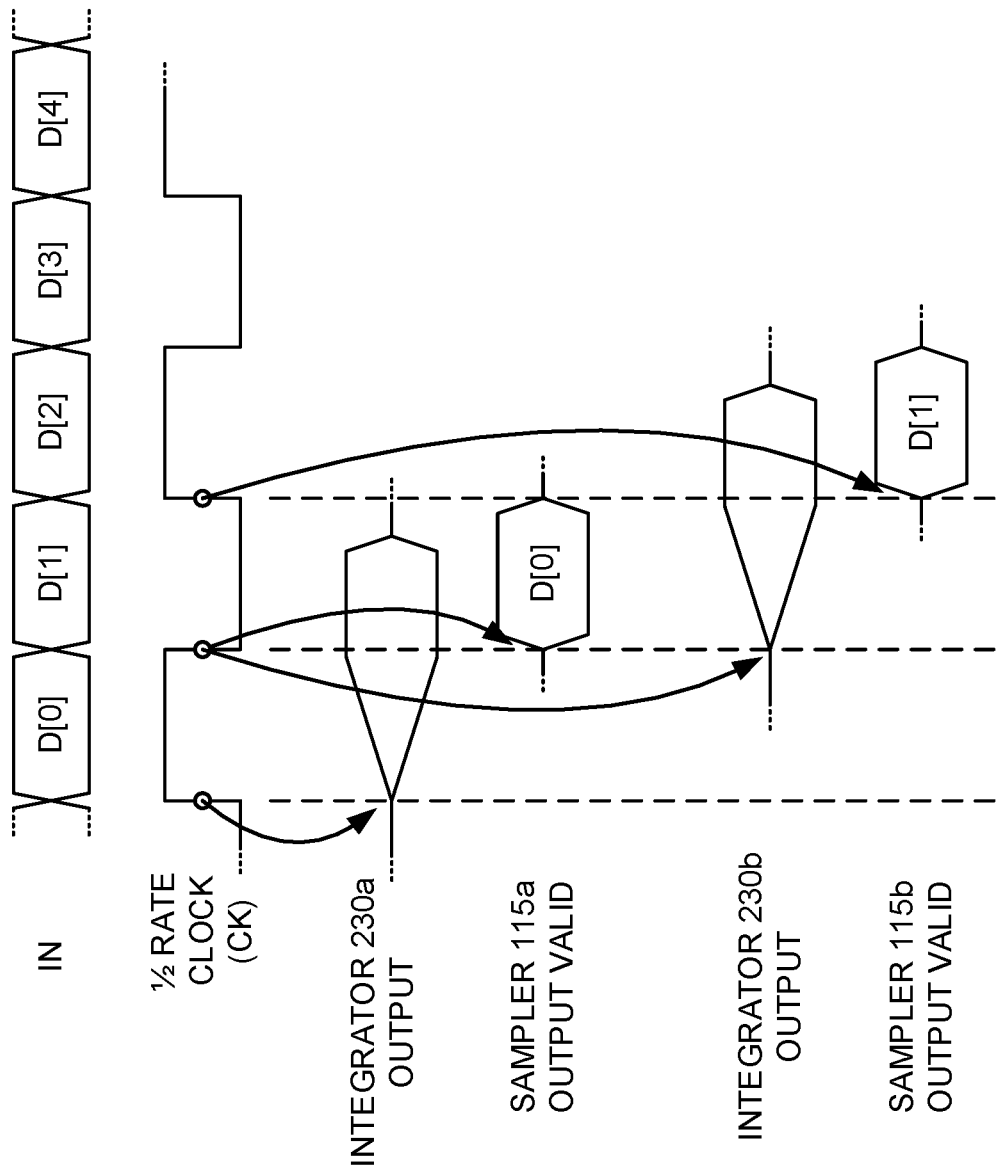
FIG. 2B is an example timing diagram illustrating the operation of a half rate integrating receiver.

The outputs of sampler 215a (OUT[0]) and sampler 215b (OUT[1]) are also input to low-frequency equalizer 220. Low-frequency equalizer 220 operates to compensate for baseline wander on the output of front-end 240 (BL) caused by unbalanced numbers of symbols being received at the input, IN. Examples of circuits and techniques that can be used as low-frequency equalizer 220 are described herein with reference to one or more of FIG. 3-5, and LF EQ circuits 320, 420, and/or 520. FIG. 2B is an example timing diagram illustrating the operation of half rate integrating receiver 200.

Figure 3:
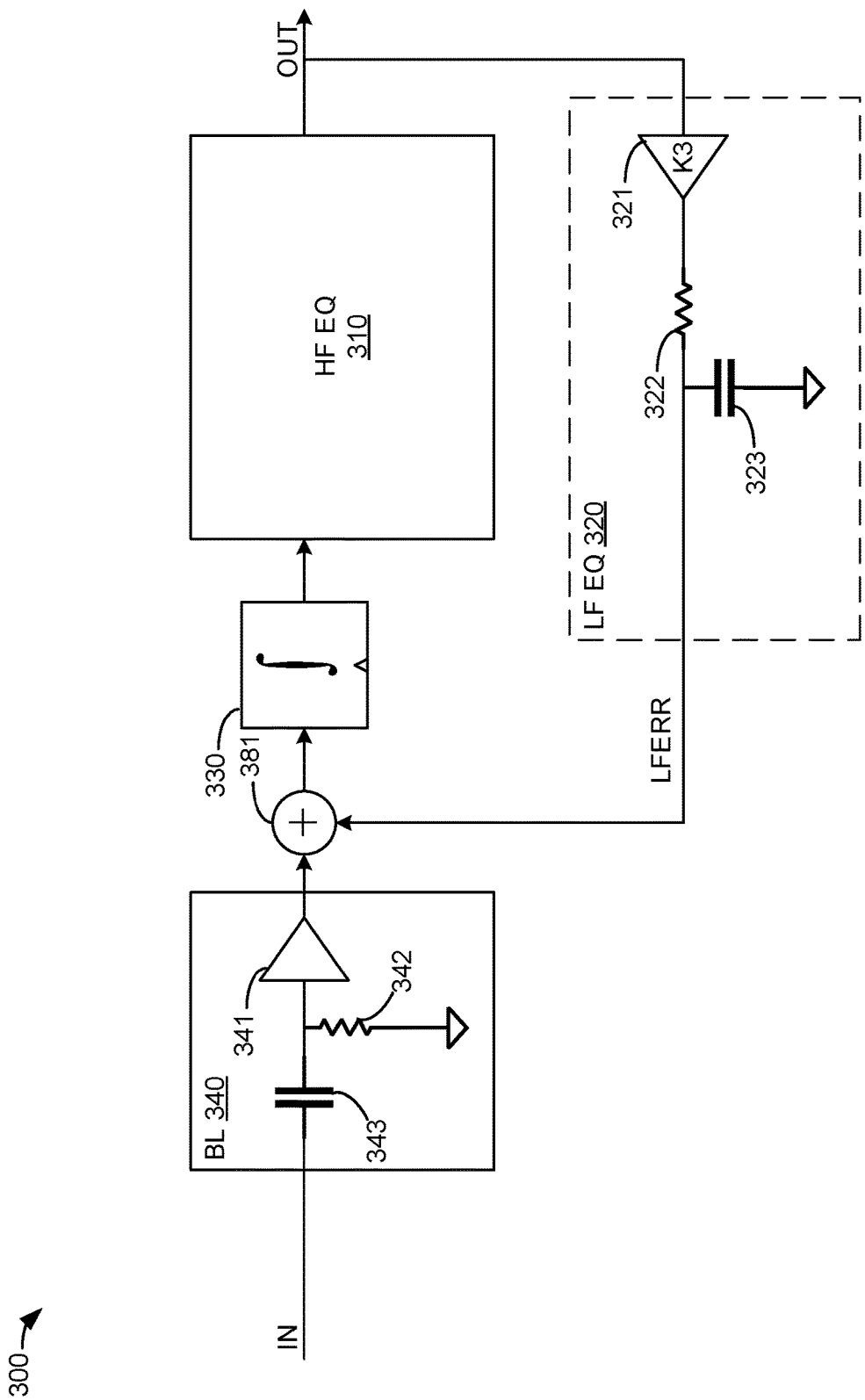
FIG. 3 is a block diagram illustrating a receiver with noise reduction and analog baseline wander correction.

FIG. 3 is a block diagram illustrating a receiver with noise reduction and analog baseline wander correction. In FIG. 3, receiver 300 comprises high-frequency equalizer (HF EQ) 310, low-frequency equalizer 320, summer 381, integrator circuit 330, and bandwidth limiter 340. Low-frequency equalizer 320 includes buffer 321, resistor 322, and capacitor 323. Bandwidth limiter 340 includes buffer/amplifier 341, resistor 342, and capacitor 343.

Bandwidth limiter 340 is an example of a band limiting front-end circuit. A first terminal of capacitor 343 is connected to an input signal (IN). The second terminal of capacitor 343 is connected to a first terminal of resistor 342. The second terminal of resistor 342 is connected to a power supply (i.e., low impedance) voltage. The second terminal of capacitor 343 and the second terminal of resistor 342 are also connected to the input of buffer/amplifier 341. The output of buffer/amplifier 341 is provided to summer 381. Thus, it should be understood that in FIG. 3, bandwidth limiter 340 includes at least a first-order high pass filter formed using resistor 342 and capacitor 343. This configuration is intended to be an example of a high-pass filter. Other filter configurations (e.g., higher order filters) with other frequency characteristics (e.g., bandpass, band rejection, etc.) may be used.

Low frequency equalizer 320 is an example of an analog wander correction circuit. The output of receiver 300 is provided to the input of buffer 321. The output of buffer 321 is connected to a first terminal of resistor 322. The second terminal of resistor 322 is connected to a first terminal of capacitor 323. The second terminal of capacitor 323 is connected to a power supply (i.e., low impedance) voltage. The second terminal of resistor 322 and the first terminal of capacitor 323 are also connected to a second input of summer 381. The second input of summer 381 receives the error correction signal LFERR that is produced by LF EQ 320. It should be understood that in FIG. 3, LF EQ 320 includes a first-order low pass filter formed using resistor 322 and capacitor 323. This configuration is intended to be an example of a low-pass filter that is matched to reduce or effectively eliminate the low-frequency error (e.g., baseline wander) caused by the high-pass filter characteristic of bandwidth limiter 340. Other filter configurations (e.g., higher order filters) with other frequency characteristics (e.g., bandpass, band rejection, etc.) may be used.

The output of summer 330 is provided to integrator circuit 330. The output of integrator circuit 330 is provided to high-frequency equalizer 310. The output of high-frequency equalizer 310 is used as the output (OUT) of receiver 300. Integrator circuit 330 and HF EQ are equivalent, the same, or function in a same or similar manner, to HF EQ 110 and/or HF EQs 210a-210b.

Figure 4:
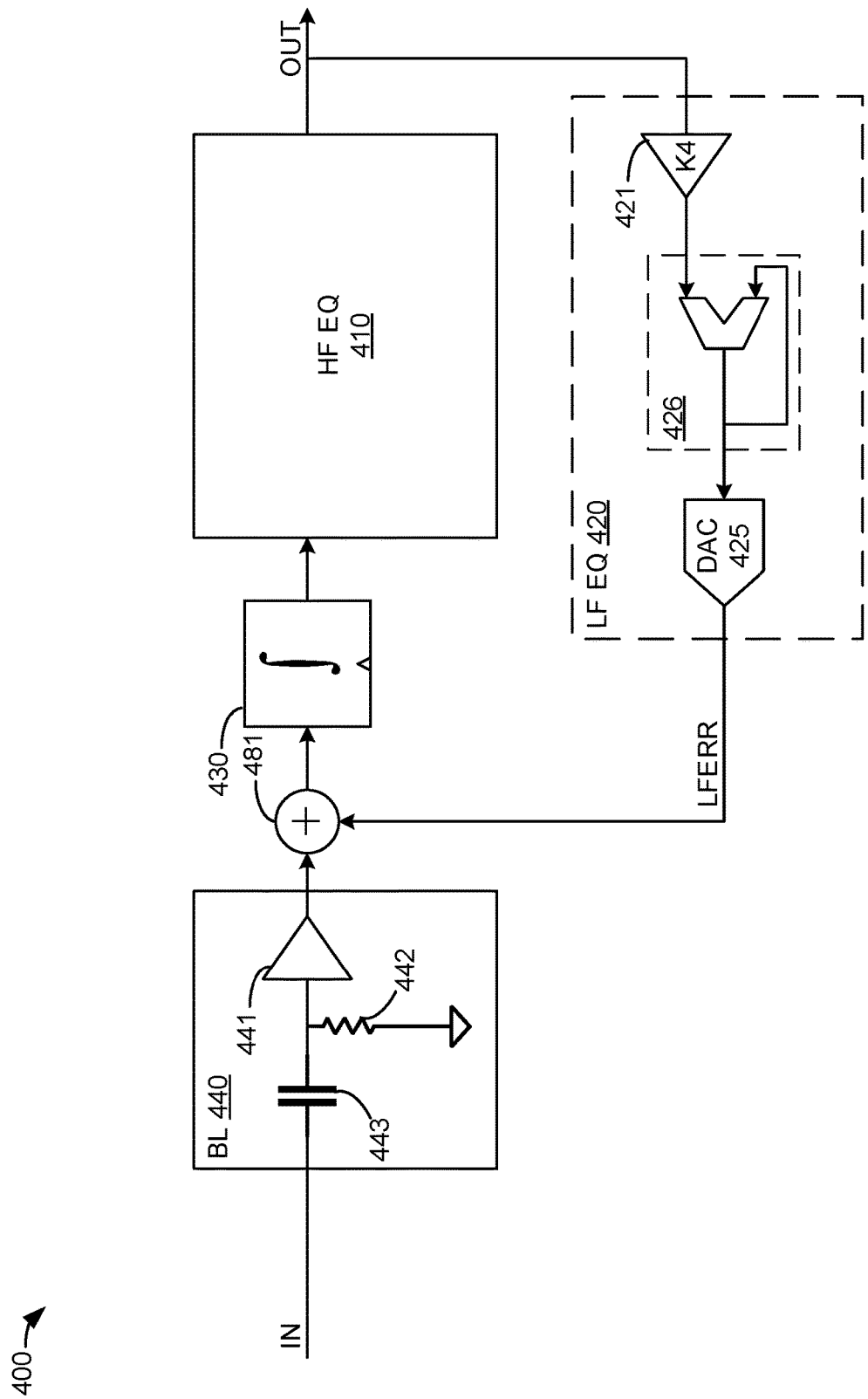
FIG. 4 is a block diagram illustrating a receiver with noise reduction and digital baseline wander correction.

FIG. 4 is a block diagram illustrating a receiver with noise reduction and digital baseline wander correction. In FIG. 4, receiver 400 comprises high-frequency equalizer (HF EQ) 410, digital low-frequency equalizer 420, summer 481, integrator circuit 430, and bandwidth limiter 440. Digital low-frequency equalizer 420 includes scaler 421, accumulator 426, and digital-to-analog converter (DAC) 425. Bandwidth limiter 440 includes buffer/amplifier 441, resistor 442, and capacitor 443.

Bandwidth limiter 440 is an example of a band limiting front-end circuit. A first terminal of capacitor 443 is connected to an input signal (IN). The second terminal of capacitor 443 is connected to a first terminal of resistor 442. The second terminal of resistor 442 is connected to a power supply (i.e., low impedance) voltage. The second terminal of capacitor 443 and the second terminal of resistor 442 are also connected to the input of buffer/amplifier 441. The output of buffer/amplifier 441 is provided to summer 481. Thus, it should be understood that in FIG. 4, bandwidth limiter 440 includes at least a first-order high pass filter formed using resistor 442 and capacitor 443. This configuration is intended to be an example of a high-pass filter. Other filter configurations (e.g., higher order filters) with other frequency characteristics (e.g., bandpass, band rejection, etc.) may be used.

Low frequency equalizer 420 is an example of a digital wander correction circuit. The output of receiver 400 is provided to the input of scaler 421. Scaler 421 converts the logical 1's and 0's output by receiver 400 to positive and/or negative a digital values. The series of digital values (e.g., +0.5, −0.5, +1, −1, etc.) for each cycle are accumulated by accumulator 426 to create a digital value that is representative of the mismatch (over time) between the number of 1's and 0's received by receiver 400. This representative value is provided to DAC 425. DAC 425 outputs an analog error correction voltage (or current), LFERR, that corresponds to at least part of the effect the mismatch between the number of 1's and 0's received by receiver 400 has affected baseline voltage provided by bandwidth limiter 440. This configuration is intended to be an example of a digital method to reduce or effectively eliminate the low-frequency error (e.g., baseline wander) caused by the high-pass filter characteristic of bandwidth limiter 440. Other configurations (e.g., using a look-up table on the output of accumulator 426 to provide an exponential based function) with other characteristics may be used.

The output of summer 481 is provided to integrator circuit 430. The output of integrator circuit 430 is provided to high-frequency equalizer 410. The output of high-frequency equalizer 410 is used as the output (OUT) of receiver 400. Integrator circuit 430 and HF EQ are equivalent, the same, or function in a same or similar manner, to integrator circuits 130, 230a-230b, 330 and HF EQ 110, HF EQs 210a-210b, and/or HF EQ 310.

Figure 5:
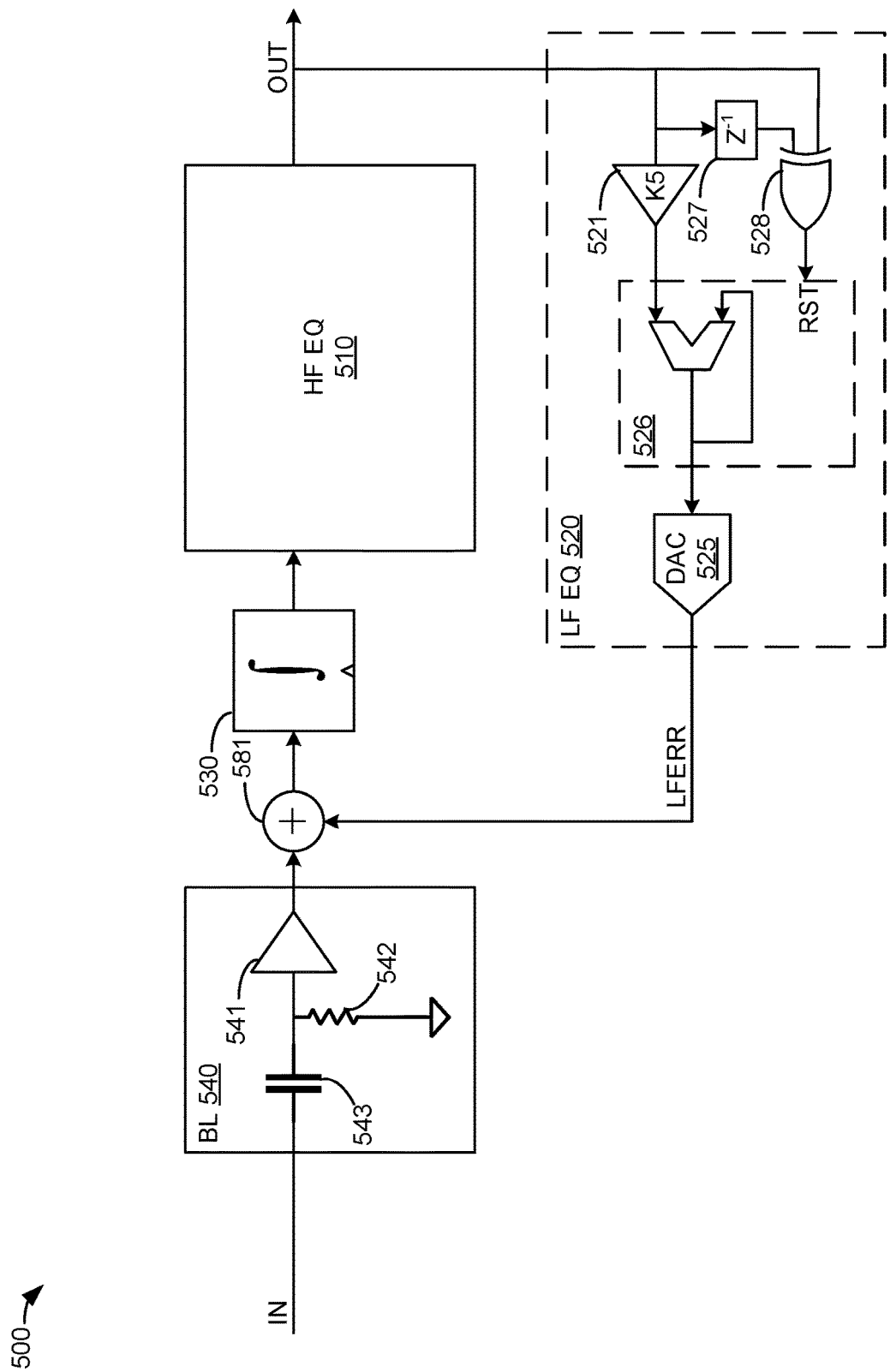
FIG. 5 is a block diagram illustrating a receiver with resetting baseline wander correction.

FIG. 5 is a block diagram illustrating a receiver with noise reduction and digital baseline wander correction. In FIG. 5, receiver 500 comprises high-frequency equalizer (HF EQ) 510, digital low-frequency equalizer 520, summer 581, integrator circuit 530, and bandwidth limiter 540. Digital low-frequency equalizer 520 includes scaler 521, delay 527, XOR 528, accumulator 526, and digital-to-analog converter (DAC) 525. Bandwidth limiter 540 includes buffer/amplifier 541, resistor 542, and capacitor 543.

Bandwidth limiter 540 is an example of a band limiting front-end circuit. A first terminal of capacitor 543 is connected to an input signal (IN). The second terminal of capacitor 543 is connected to a first terminal of resistor 542. The second terminal of resistor 542 is connected to a power supply (i.e., low impedance) voltage. The second terminal of capacitor 543 and the second terminal of resistor 542 are also connected to the input of buffer/amplifier 541. The output of buffer/amplifier 541 is provided to summer 581. Thus, it should be understood that in FIG. 5, bandwidth limiter 540 includes at least a first-order high pass filter formed using resistor 542 and capacitor 543. This configuration is intended to be an example of a high-pass filter. Other filter configurations (e.g., higher order filters) with other frequency characteristics (e.g., bandpass, band rejection, etc.) may be used.

Low frequency equalizer 520 is an example of a digital wander correction circuit. The output of receiver 500 is provided to the input of scaler 521. Scaler 521 converts the logical 1's and 0's output by receiver 500 to positive and/or negative digital values. The series of digital values (e.g., +0.5, −0.5, +1, −1, etc.) for each symbol period are accumulated by accumulator 526 to create a digital value that is representative of the number of consecutive 1's and 0's received by receiver 500. Each time a string of consecutive 1's or 0's is broken, unit delay 527 and XOR 528 cause accumulator 526 to reset to a value (e.g., 0) that does not correct for baseline wander. Because a transition is a high-frequency event, a transition removes the need for low-frequency (i.e., baseline) correction. The digital value that is representative of the number of consecutive 1's and 0's value is provided to DAC 525. DAC 525 outputs an analog error correction voltage (or current), LFERR, that corresponds to at least part of the effect the consecutive 1's and 0's received by receiver 500 has affected baseline voltage provided by bandwidth limiter 540.

This configuration is intended to be an example of a digital method to reduce or effectively eliminate the low-frequency error (e.g., baseline wander) caused by the high-pass filter characteristic of bandwidth limiter 540. Other configurations (e.g., using a look-up table on the output of accumulator 526 to provide an exponential based function) with other characteristics may be used.

The output of summer 582 is provided to integrator circuit 530. The output of integrator circuit 530 is provided to high-frequency equalizer 510. The output of high-frequency equalizer 510 is used as the output (OUT) of receiver 500. Integrator circuit 530 and HF EQ are equivalent, the same, or function in a same or similar manner, to integrator circuits 130, 230a-230b, 330 and HF EQ 110, HF EQs 210a-210b, HF EQ 310, and/or HF EQ 410.

Figure 6:
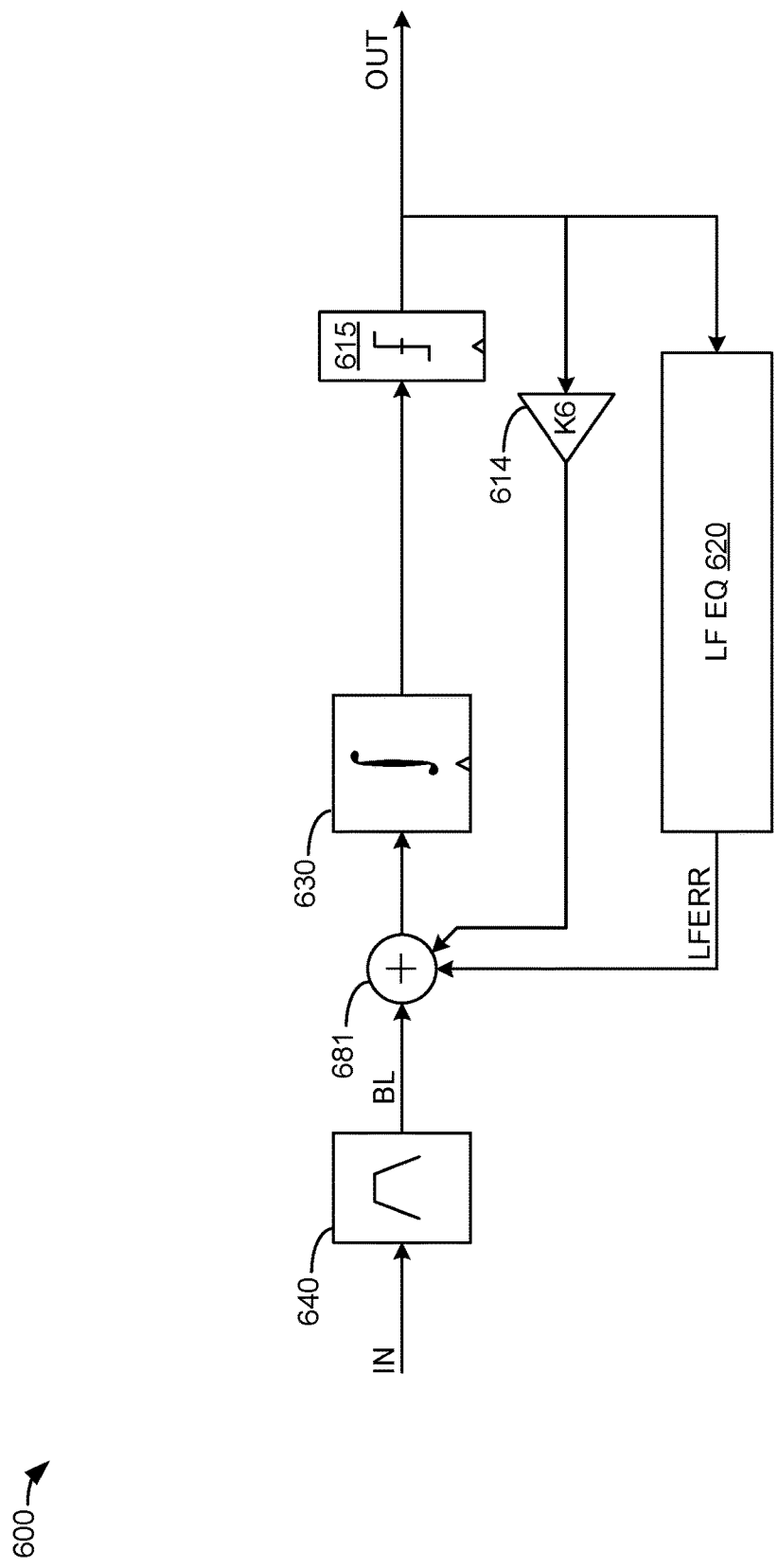
FIG. 6 is a block diagram illustrating a receiver for a noise limited signaling system.

FIG. 6 is a block diagram illustrating a receiver for a noise limited signaling system. In FIG. 6, receiver 600 comprises, summer 681, integrator circuit 630, sampler 615, buffer 614, low-frequency equalizer 620, and front-end 640.

An input signal (IN) is provided to front-end 640. Front-end 640 may comprise one or more amplifier stages (e.g., a low noise amplifier—LNA), one or more filters, or both. Front-end 640 outputs a band limited signal, BL. The band limitations of signal BL may be a result of one or more of the amplification characteristics (e.g., amplification bandwidth, cutoff frequencies, etc.) of the amplifier(s), filter circuits within front-end 640, and/or the channel that the input signal has traversed.

The bandwidth limited signal (BL) output by front-end 640 is provided to a first input to summer 681. Summer 681 receives, at a second input, an error correction signal (LFERR) from low-frequency equalizer 620. The error correction signal from low-frequency equalizer 620 reduces or effectively eliminates caused by long (relative to the lower cutoff frequency of front-end 640) strings of one type of symbol versus another. The output of summer 681 is provided to integrator 630.

Integrator 630 integrates the signal from summer 681 over a period of time (e.g., symbol time or partial symbol time) and provides that output to sampler 615. The output of sampler 615 is provided to buffer 614. The output of buffer 614 is provided to a third input to summer 612 in order to apply equalization to the input to of integrator 630 based on the symbol sampled by sampler 615 from the immediately preceding symbol time.

The output of sampler 615 (OUT) indicates the symbol that is received. Thus, it should be understood that buffer 614 and the third input to summer 681 form a high-frequency equalizer that operates on the current symbol to remove ISI caused by the previous symbol's value. The output of sampler 115 (OUT) is also the output of receiver 100.

The output of sampler 615 (OUT) is also input to low-frequency equalizer 620. Low-frequency equalizer 620 operates to compensate for baseline wander on the output of front-end 640 (BL) caused by unbalanced numbers of symbols being received at the input, IN. For example, when front-end 640 has a low-frequency (and/or DC) band rejection effect, a long string of the same value of symbol has a frequency spectrum that is significantly blocked by this band-blocking characteristic. Low-frequency equalizer 620 is configured to receive the output of sampler 615 and (at least partially) compensate for the blocked low-frequency components of the input signal (IN). Examples of circuits and techniques that can be used as low-frequency equalizer 620 are described herein with reference to one or more of FIG. 3-5, and LF EQ circuits 320, 420, and/or 520.

Figure 7:
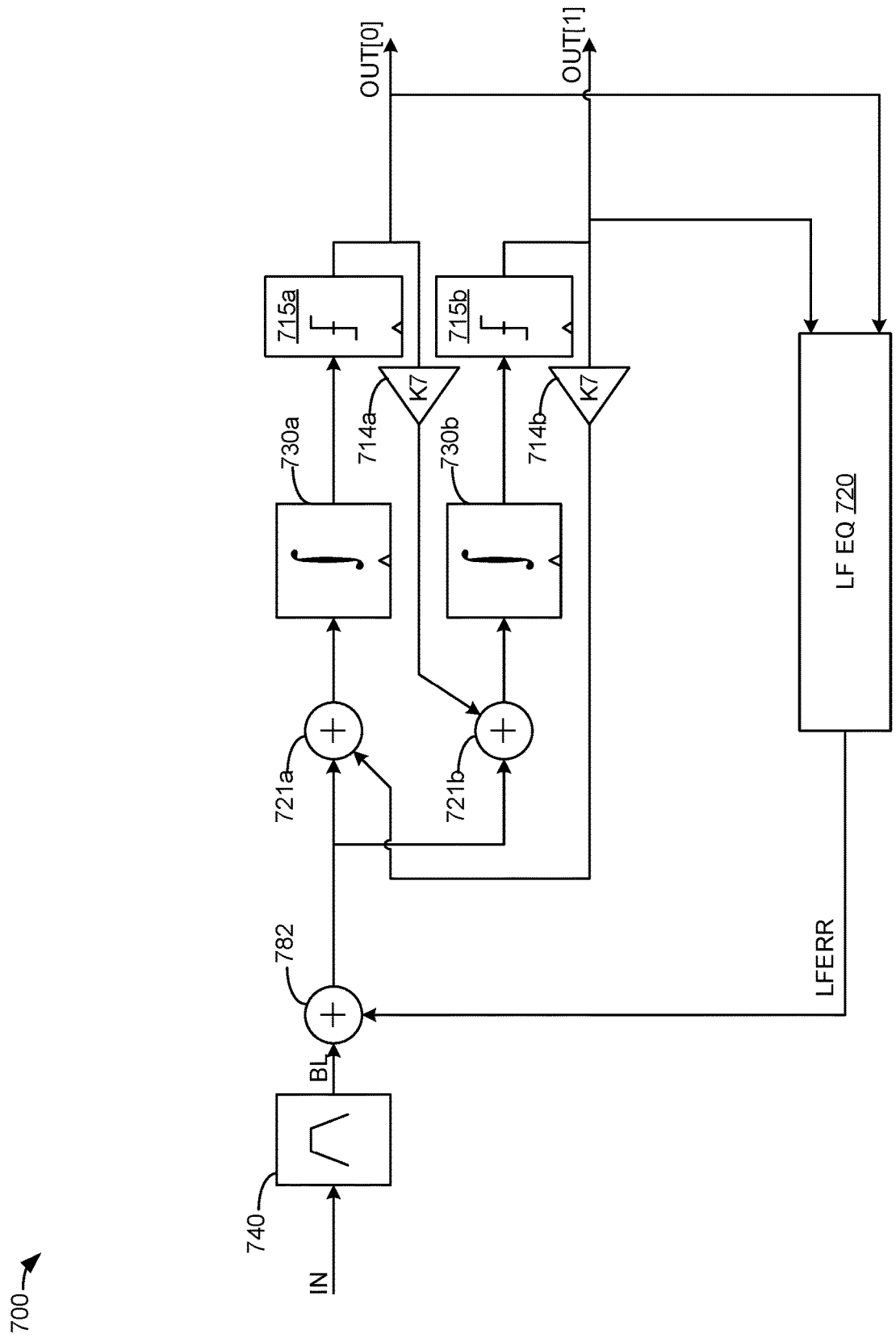
FIG. 7 is a block diagram illustrating a half rate receiver.

FIG. 7 is a block diagram illustrating a half rate receiver. In FIG. 7, receiver 700 comprises low-frequency equalizer (LF EQ) 720, summers 721a-721b, summer 782, integrator circuit 730a, integrator circuit 730b, and front-end 740.

An input signal (IN) is provided to front-end 740. Front-end 740 may comprise one or more amplifier stages (e.g., a low noise amplifier—LNA), one or more filters, or both. Front-end 740 outputs a band limited signal, BL. The band limitations of signal BL may be a result of one or more of the amplification characteristics (e.g., amplification bandwidth, cutoff frequencies, etc.) of the amplifier(s), filter circuits within front-end 740, and/or the channel that the input signal has traversed.

The bandwidth limited signal (BL) output by front-end 740 is provided to a first input to summer 782. Summer 782 receives, at a second input, an error correction signal (LFERR) from low-frequency equalizer 720. The error correction signal from low-frequency equalizer 720 reduces or effectively eliminates effects caused by long and/or unbalanced (relative to the lower cutoff frequency of front-end 740) strings of one type of symbol versus another. The output of summer 782 is provided to inputs of summer 721a and 721b.

Integrators 730a and 730b integrate the signal from summers 721a-721b, respectively, over alternating periods of time (e.g., alternating successive symbol times) and provides their respective outputs to sampler 715a and sampler 715b, respectively. The output of sampler 715a is provided to buffer 714a. The output of buffer 714a is provided to a second input to summer 721b in order to apply equalization to the input to of integrator 730b based on the symbol sampled by sampler 715a from the immediately preceding symbol time. The output of sampler 715b is provided to buffer 714b.

The output of buffer 714b is provided to a second input to summer 721a in order to apply equalization to the input to integrator 730a based on the symbol sampled by sampler 715b from the immediately preceding symbol time. Thus, it should be understood that sampler 715b and buffer 714b function as a high-frequency equalizer that operates on the current symbol to remove ISI caused by the previous symbol's value as determined by sampler 715b. The output of sampler 715b is the odd cycle output of receiver 200 (OUT[1]).

The output of buffer 714a is provided to a second input to summer 721b in order to apply equalization to the input to of integrator 730b based on the symbol sampled by sampler 715a from the immediately preceding symbol time. Thus, it should be understood that sampler 715a and buffer 714a function as a high-frequency equalizer that operates on the current symbol to remove ISI caused by the previous symbol's value as determined by sampler 715a. The output of sampler 715a is the even cycle output of receiver 700 (OUT[0]).

The outputs of sampler 715a (OUT[0]) and sampler 715b (OUT[1]) are also input to low-frequency equalizer 720. Low-frequency equalizer 720 operates to compensate for baseline wander on the output of front-end 740 (BL) caused by unbalanced numbers of symbols being received at the input, IN. Examples of circuits and techniques that can be used as low-frequency equalizer 720 are described herein with reference to one or more of FIG. 3-5, and LF EQ circuits 320, 420, and/or 520.

Figure 8A:
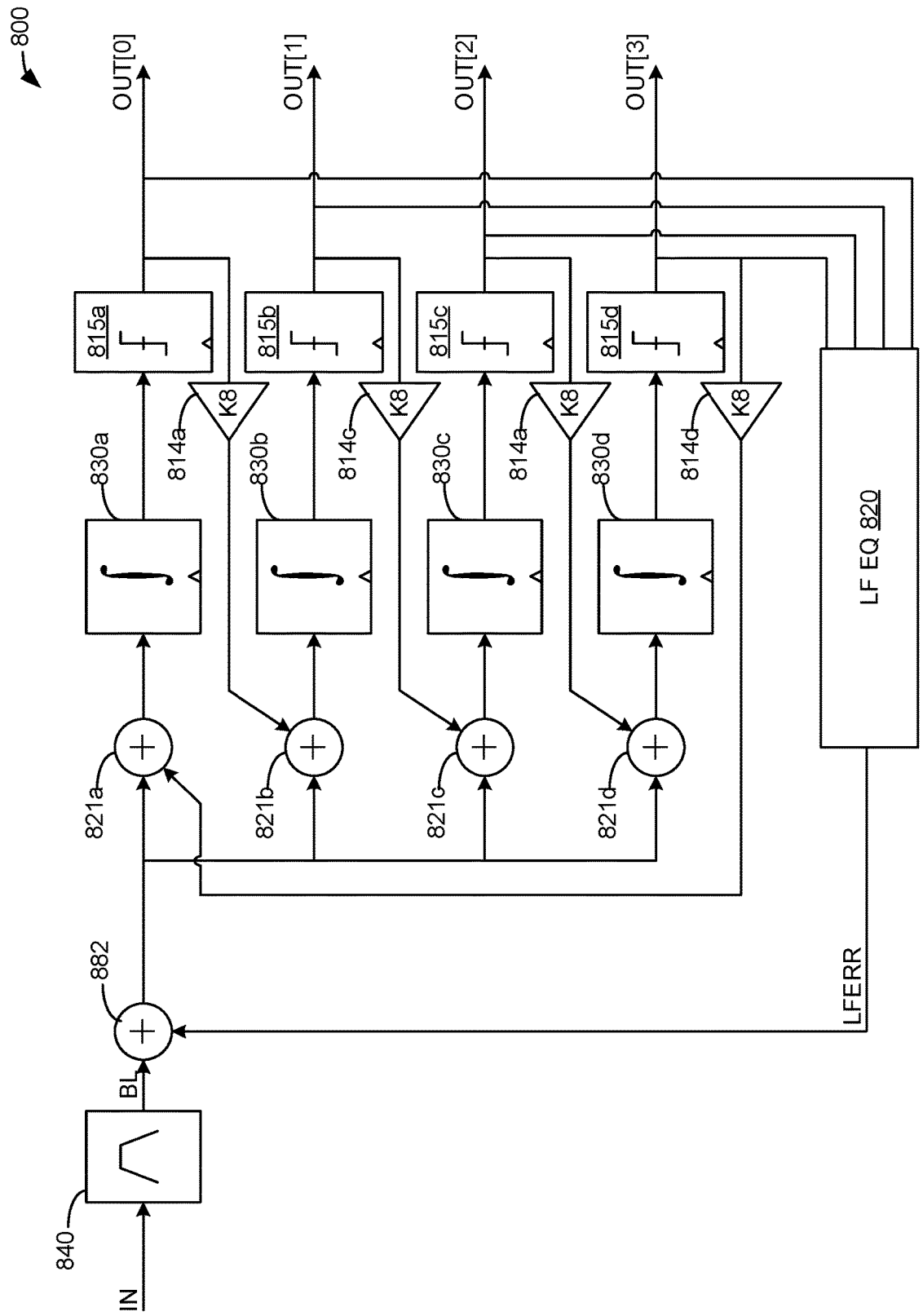
FIG. 8A is a block diagram illustrating a quarter rate integrating receiver.

FIG. 8A is a block diagram illustrating a quarter rate integrating receiver. In FIG. 8, receiver 800 comprises low-frequency equalizer (LF EQ) 820, summers 821a-821d, summer 882, integrator circuits 830a-830d, and front-end 840.

An input signal (IN) is provided to front-end 840. Front-end 840 may comprise one or more amplifier stages (e.g., a low noise amplifier—LNA), one or more filters, or both. Front-end 840 outputs a band limited signal, BL. The band limitations of signal BL may be a result of one or more of the amplification characteristics (e.g., amplification bandwidth, cutoff frequencies, etc.) of the amplifier(s), filter circuits within front-end 840, and/or the channel that the input signal has traversed.

The bandwidth limited signal (BL) output by front-end 840 is provided to a first input to summer 882. Summer 882 receives, at a second input, an error correction signal (LFERR) from low-frequency equalizer 820. The error correction signal from low-frequency equalizer 820 reduces or effectively eliminates effects caused by long (relative to the lower cutoff frequency of front-end 840) strings of one type of symbol versus another. The output of summer 882 is provided to inputs of summers 821*a*-821*d*.

Integrators 830*a*-830*d* integrate the signal from summer 882 over successive periods of time (e.g., four successive symbol times) and provides their respective outputs to samplers 815*a*-815*d*, respectively. The output of sampler 815*a* is provided to buffer 814*a*. The output of buffer 814*a* is provided to a second input to summer 821*b* in order to apply equalization to the input to of integrator 830*b* based on the symbol sampled by sampler 815*a* from the immediately preceding symbol time. The output of sampler 815*a* is a data period output of receiver 800 (OUT[0]).

The output of sampler 815*b* is provided to buffer 814*b*. The output of buffer 814*b* is provided to a second input to summer 821*c* in order to apply equalization to the input to integrator 830*c* based on the symbol sampled by sampler 815*b* from the immediately preceding symbol time. The output of sampler 815*b* is a data period output of receiver 800 (OUT[1]). The output of sampler 815*c* is provided to buffer 814*c*. The output of buffer 814*c* is provided to a second input to summer 821*d* in order to apply equalization to the input to integrator 830*d* based on the symbol sampled by sampler 815*c* from the immediately preceding symbol time. The output of sampler 815*c* is a data period output of receiver 800 (OUT[2]).

The output of sampler 815*d* is provided to buffer 814*d*. The output of buffer 814*d* is provided to a second input to summer 821*a* in order to apply equalization to the input to integrator 830*a* based on the symbol sampled by sampler 815*d* from the immediately preceding symbol time. The output of sampler 815*d* is a data period output of receiver 800 (OUT[3]).

Figure 8B:
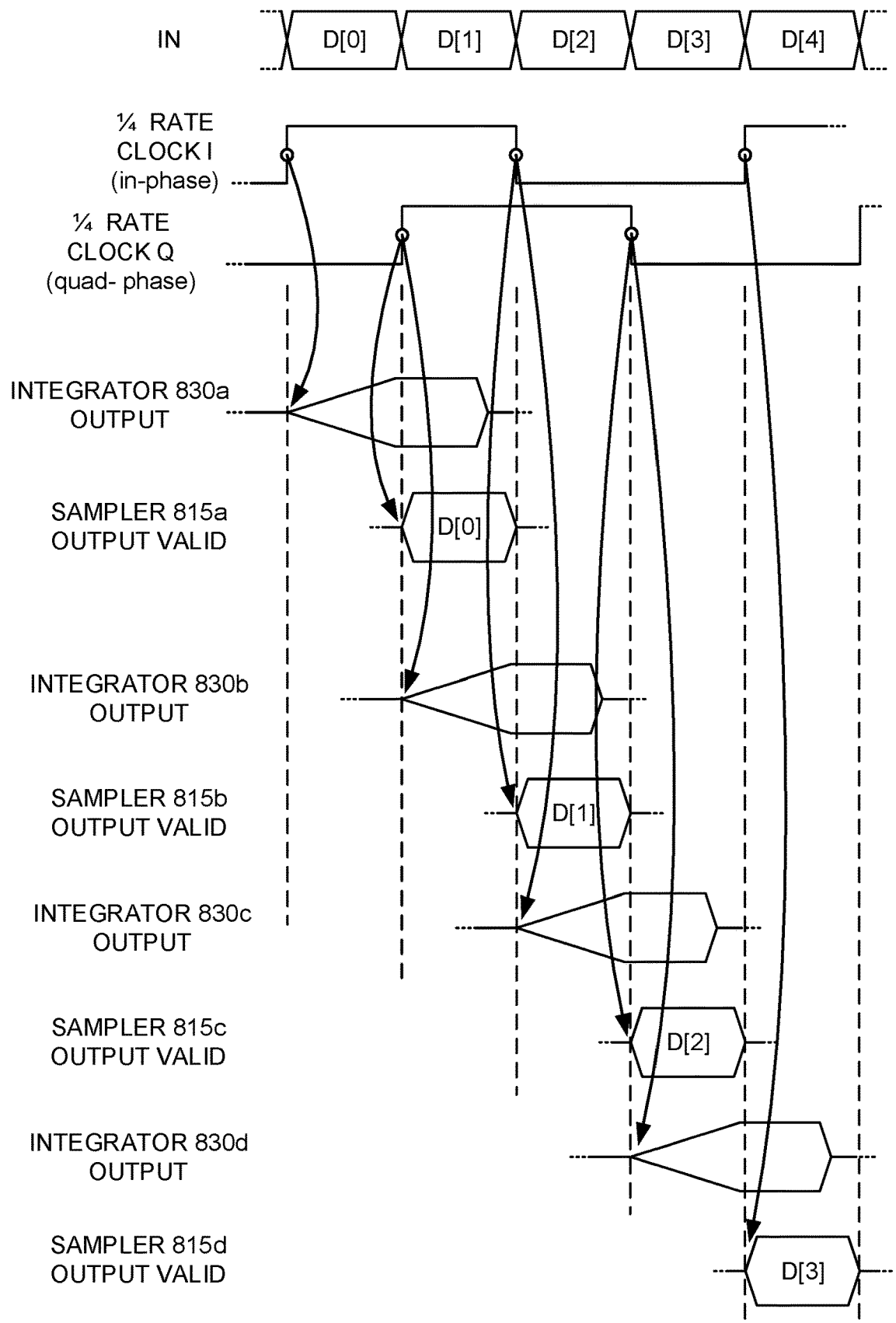
FIG. 8B is an example timing diagram illustrating the operation of a quarter rate integrating receiver.

The data period outputs (OUT[0:3]) are also input to low-frequency equalizer 820. Low-frequency equalizer 820 operates to compensate for baseline wander on the output of front-end 840 (BL) caused by unbalanced numbers of symbols being received at the input, IN. Examples of circuits and techniques that can be used as low-frequency equalizer 820 are described herein with reference to one or more of FIG. 3-5, and LF EQ circuits 320, 420, and/or 520. FIG. 8B is an example timing diagram illustrating the operation of quarter rate integrating receiver 800.

Figure 9:
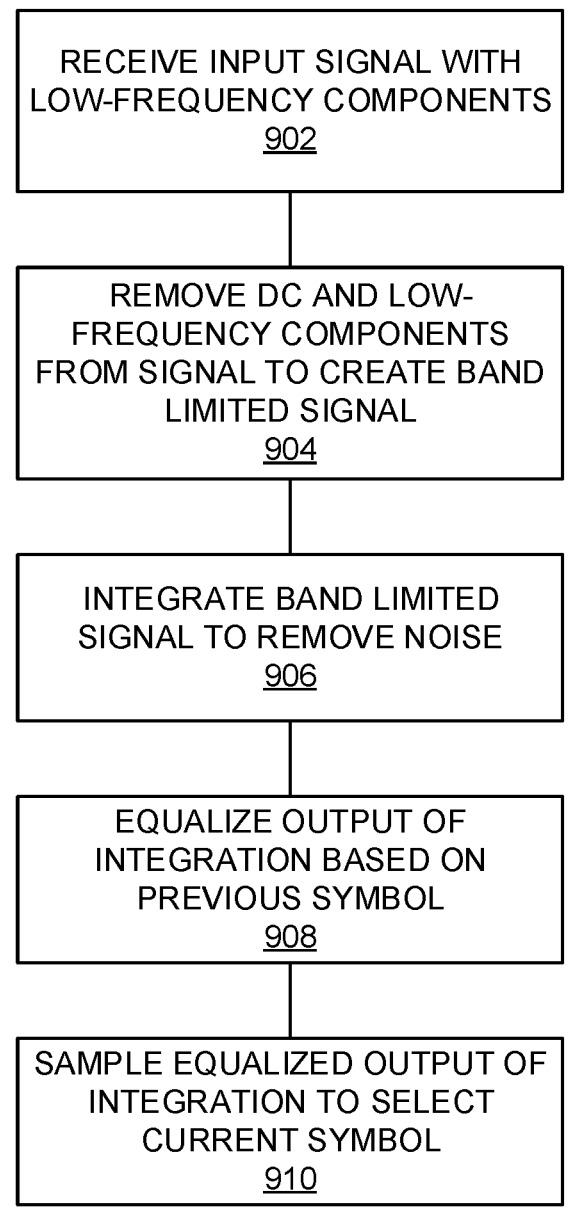
FIG. 9 is a flowchart illustrating a method of selecting received symbols in a noisy system.

FIG. 9 is a flowchart illustrating a method of selecting received symbols in a noisy system. The steps illustrated in FIG. 9 may be performed by one or more elements of receiver 100, receiver 200, receiver 300, receiver 400, and/or receiver 500. An input signal with low-frequency components is received (902). For example, receiver 100 may receive an input signal having DC and/or low-frequency components such as white and/or 1/f noise.

The DC and low-frequency components are removed (or effectively removed) to create a band limited signal (904). For example, front-end 140 may have a band-pass characteristic that removes low-frequency components (such as 1/f noise) and high-frequency components (such as white noise).

The band limited signal is integrated to remove noise (906). For example, integrator circuit 130 may integrate the band limited signal provided by front-end 140. This band limited signal may still include noise (e.g., white noise) having frequency components in the band-pass range of front-end 140.

The output of the integration is equalized based on the previous symbol (908). For example, HF EQ 110 may equalize the output of integrator 130 based on the previous symbol value output by sampler 115. The equalized output of the integration is sampled to select a current symbol (910). For example, sampler 115 may sample the equalized signal at the output of summer 112.

Figure 10:
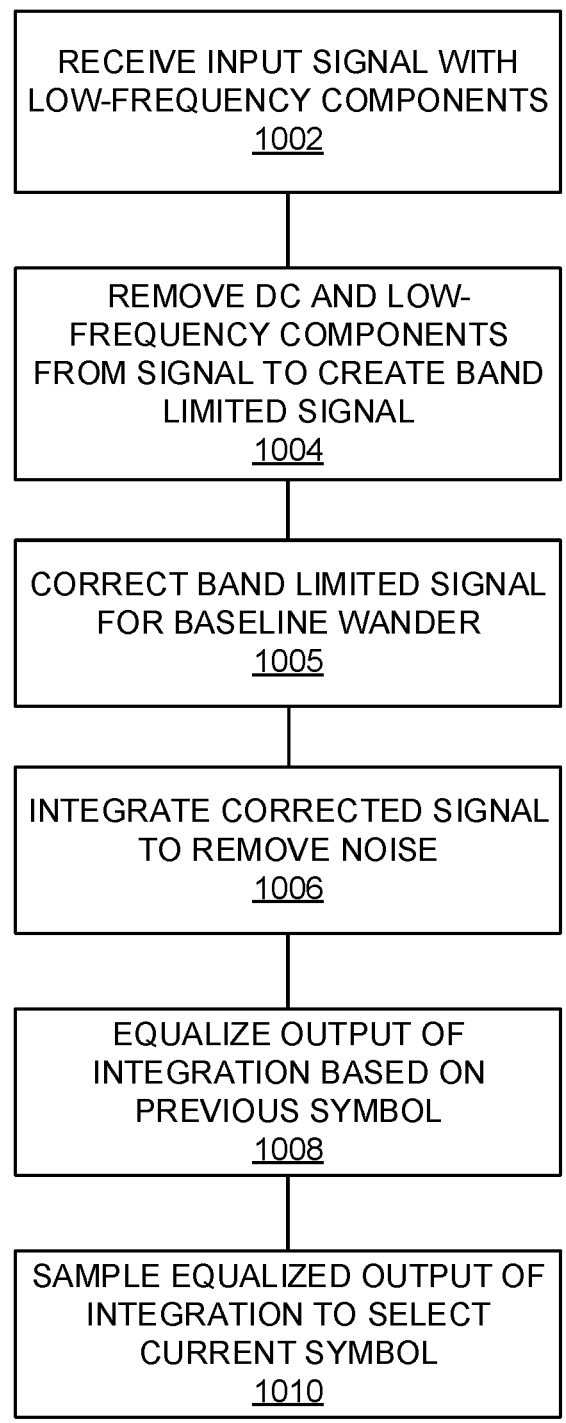
FIG. 10 is a flowchart illustrating a method of receiving in a noisy system.

FIG. 10 is a flowchart illustrating a method of receiving in a noisy system. The steps illustrated in FIG. 10 may be performed by one or more elements of receiver 100, receiver 200, receiver 300, receiver 400, and/or receiver 500. An input signal with low-frequency components is received (1002). For example, receiver 100 may receive an input signal having DC and/or low-frequency components such as white and/or 1/f noise.

The DC and low-frequency components are removed (or effectively removed) to create a band limited signal (1004). For example, front-end 140 may have a band-pass characteristic that removes low-frequency components (such as 1/f noise) and high-frequency components (such as white noise).

The band limited signal is corrected for baseline wander (1005). For example, the output of sampler LF EQ 120 may be provided to summer 181 in order to correct for baseline wander. The corrected signal is integrated to remove noise (1006). For example, integrator circuit 130 may integrate the signal provided by summer 181. This band limited signal may still include noise (e.g., white noise) having frequency components in the band-pass range of front-end 140.

The output of the integration is equalized based on the previous symbol (1008). For example, HF EQ 110 may equalize the output of integrator 130 based on the previous symbol value output by sampler 115. The equalized output of the integration is sample to select a current symbol (1010). For example, sampler 115 may sample the equalized signal at the output of summer 112.

Figure 11:
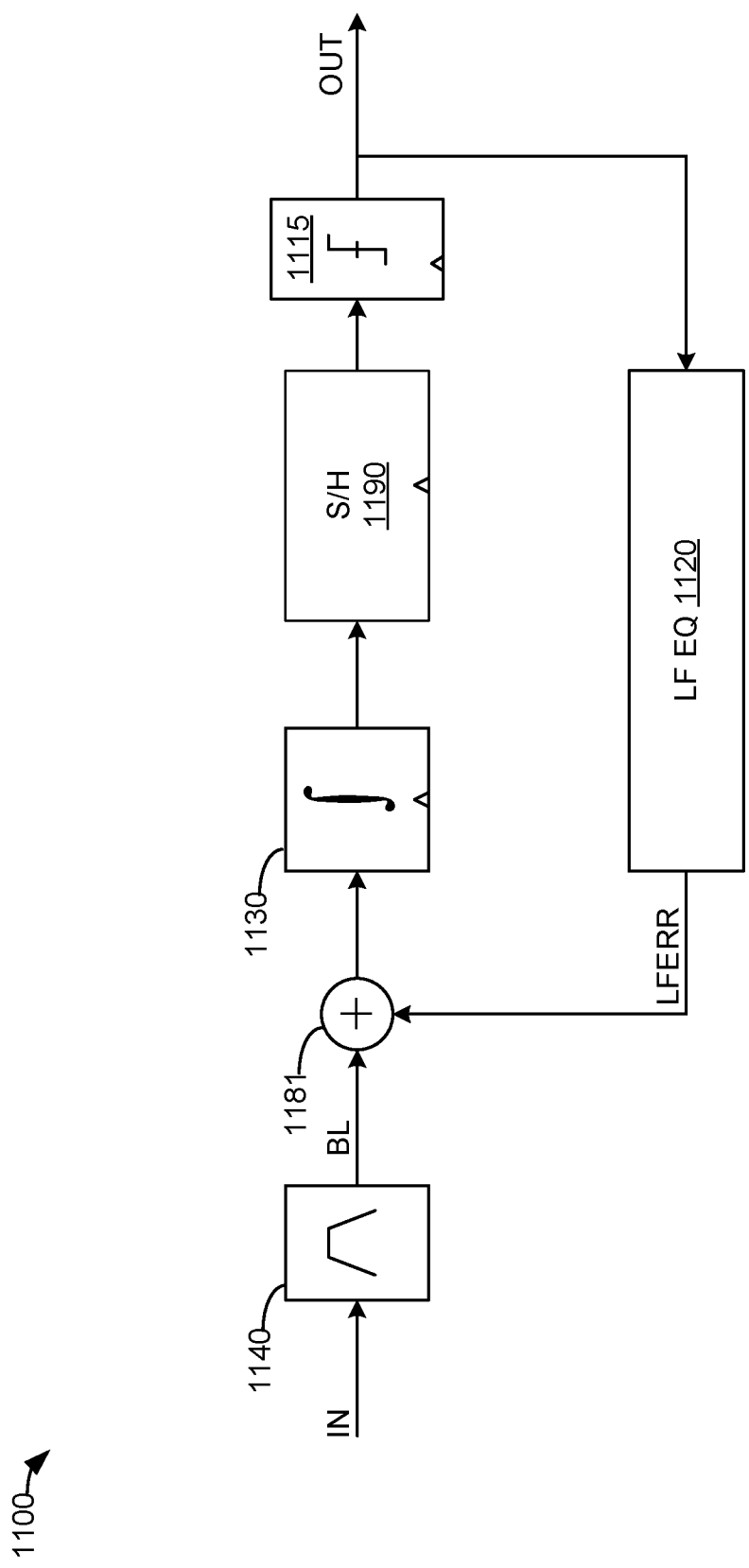
FIG. 11 illustrates an integrating receiver circuit with inter-symbol interference error.

FIG. 11 illustrates an integrating receiver circuit with inter-symbol interference error. In FIG. 11, receiver 1100 comprises sampler 1115, low-frequency equalizer (LF EQ) 1120, summer 1181, integrator circuit 1130, front-end 1140, and sample-and-hold (S/H) 1190.

An input signal (IN) is provided to front-end 1140. Front-end 1140 may comprise one or more amplifier stages, one or more filters, or both. Front-end 1140 outputs a band limited signal, BL. The band limitations of signal BL may be a result of one or more of the amplification characteristics (e.g., amplification bandwidth, cutoff frequencies, etc.) of the amplifier(s), filter circuits within front-end 1140, and/or the channel that the input signal has traversed.

The bandwidth limited signal (BL) output by front-end 1140 is provided to a first input to summer 1181. Summer 1181 receives, at a second input, an error correction signal (LFERR) from low-frequency equalizer 1120. The error correction signal from low-frequency equalizer 1120 reduces or effectively eliminates low-frequency offsets (errors) caused by long and/or unbalanced (relative to the lower cutoff frequency of front-end 1140) strings of one type of symbol versus another. The output of summer 1181 is provided to integrator 1130.

Integrator 1130 integrates the signal from summer 1181 over a period of time (e.g., symbol time or partial symbol time) and provides its output to S/H 1190. S/H 1190 tracks the output of integrator 1130 until a hold interval is begun. During the hold interval, the output of S/H 1190 is held at the last voltage input to S/H 1190. The output of S/H 1190 is provided to sampler 1115. Sampler 1115 samples the output of S/H during the hold interval. The output of sampler 1115 (OUT) indicates the symbol that is received. The output of sampler 1115 is also the output of receiver 1100.

The output of sampler 1115 is also input to low-frequency equalizer 1120. Low-frequency equalizer 1120 operates to compensate for baseline wander on the output of front-end 1140 (BL) caused by unbalanced numbers of symbols being received at the input, IN. Examples of circuits and techniques that can be used as low-frequency equalizer 1120 are described herein with reference to one or more of FIG. 3-5, and LF EQ circuits 320, 420, and/or 520.

Figure 12:
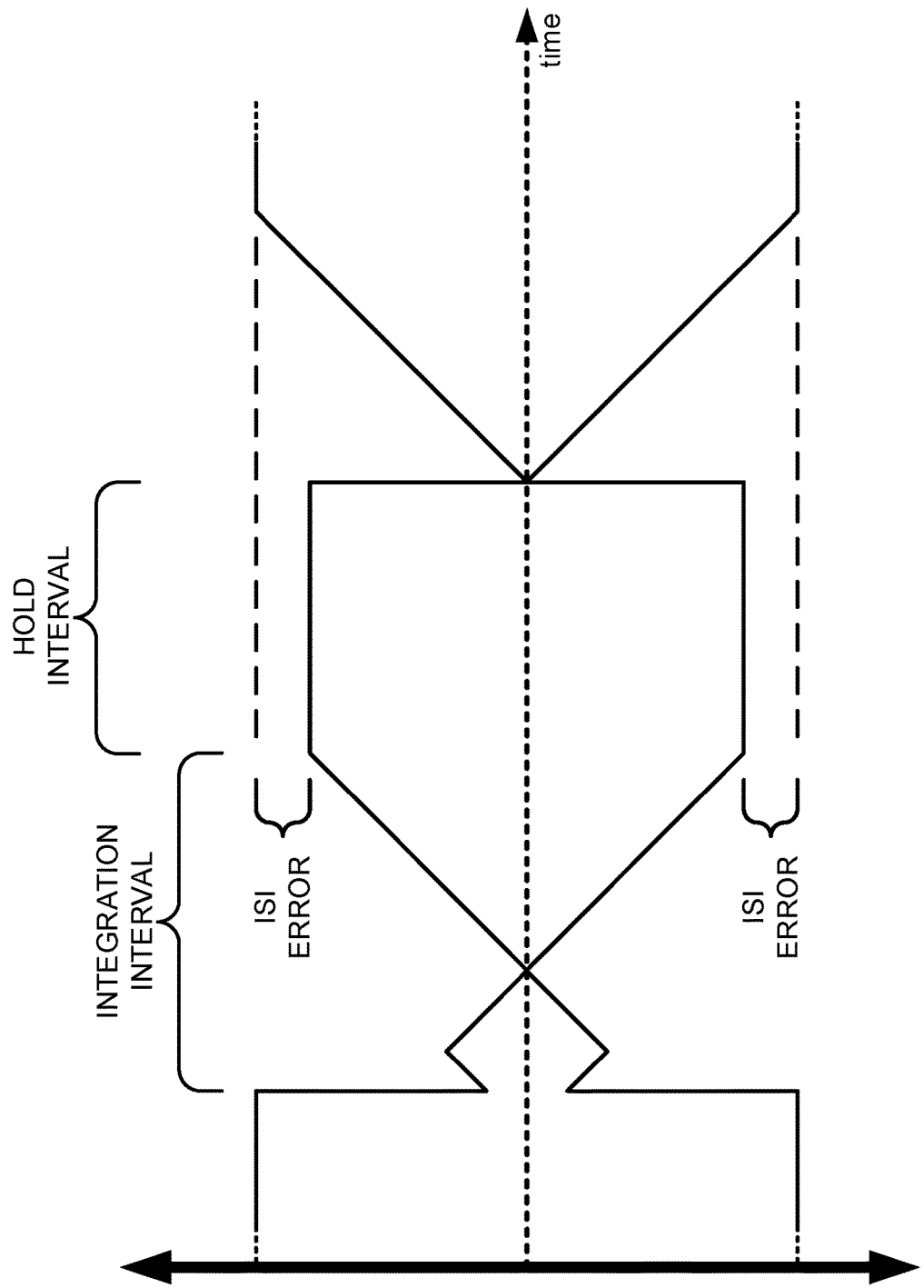
FIG. 12 is an eye diagram illustrating inter-symbol interference error.

FIG. 12 is an eye diagram illustrating inter-symbol interference error. The eye diagram illustrated in FIG. 12 may correspond to the output of receiver 1100. Note that in FIG. 12, the start point of the output of integrator 1130 (as it is output by through S/H 1190 before being held by S/H 1190) is shifted below as opposed to start from the zero. That causes the signal to saturate, when sampled by S/H 1190, at a voltage that is less than a signal without ISI.

Figure 13:
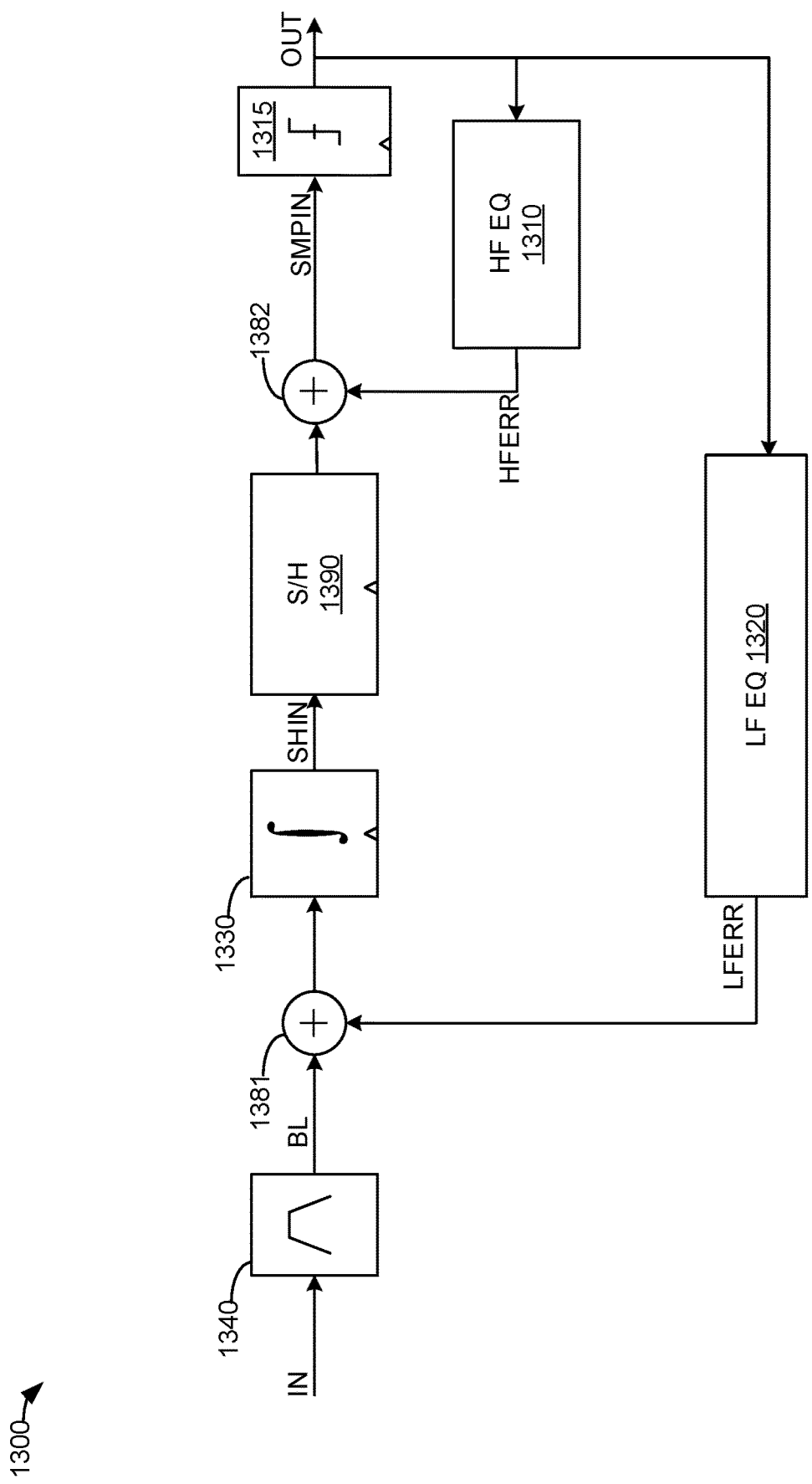
FIG. 13 illustrates an integrating receiver circuit that illustrates removing inter-symbol interference error.

FIG. 13 illustrates an integrating receiver circuit that illustrates removing inter-symbol interference error. In FIG. 13, receiver 1300 comprises HF EQ 1310, LF EQ 1320, summer 1381, summer 1382, integrator circuit 1330, front-end 1340, and sample-and-hold (S/H) 1390.

An input signal (IN) is provided to front-end 1340. Front-end 1340 may comprise one or more amplifier stages, one or more filters, or both. Front-end 1340 outputs a band limited signal, BL. The band limitations of signal BL may be a result of one or more of the amplification characteristics (e.g., amplification bandwidth, cutoff frequencies, etc.) of the amplifier(s), filter circuits within front-end 1340, and/or the channel that the input signal has traversed.

The bandwidth limited signal (BL) output by front-end 1340 is provided to a first input to summer 1381. Summer 1381 receives, at a second input, an error correction signal (LFERR) from low-frequency equalizer 1320. The error correction signal from low-frequency equalizer 1320 reduces or effectively eliminates low-frequency offsets (errors) caused by long and/or unbalanced (relative to the lower cutoff frequency of front-end 1340) strings of one type of symbol versus another. The output of summer 1381 is provided to integrator 1330.

Integrator 1330 integrates the signal from summer 1381 over a period of time (e.g., symbol time or partial symbol time) and provides its output to S/H 1390. The output of S/H 1390 is provided to a first input of summer 1382. The output of summer 1382 (SMPIN) is provided to the input of sampler 1315. The output of sampler 1315 indicates the symbol that is received. The output of sampler 1315 is also the output of receiver 1300.

The output of sampler 1315 is also input to low-frequency equalizer 1320. Low-frequency equalizer 1320 operates to compensate for baseline wander on the output of front-end 1340 (BL) caused by unbalanced numbers of symbols being received at the input, IN. Examples of circuits and techniques that can be used as low-frequency equalizer 1320 are described herein with reference to one or more of FIG. 3-5, and LF EQ circuits 320, 420, and/or 520.

The output of sampler 1315 is also input to HF EQ 1310. HF EQ 1310 applies equalization to the output of sampler 1315 based on the symbol sampled by sampler 1315 from the immediately preceding symbol time. The HF EQ error correction signal (HFERR) is provided to a second input of summer 1382 to produce a corrected (e.g., ISI removed) signal (SMPIN) to sampler 1315. It should be understood that sampler 1315, HF EQ 1310, and summer 1382 form a one-tap discrete finite equalization (DFE) loop.

Figure 14:
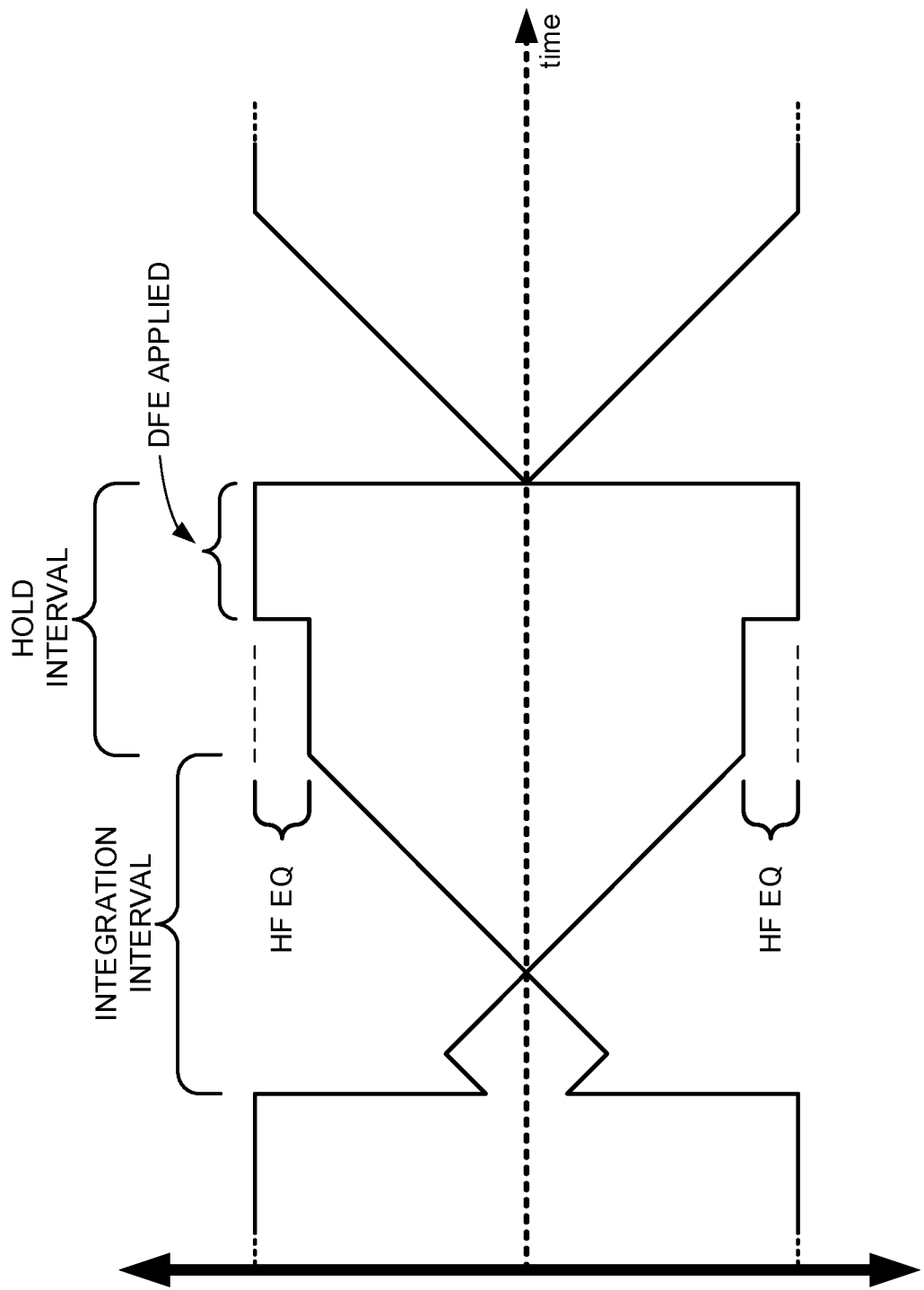
FIG. 14 is an eye diagram illustrating inter-symbol equalization.

FIG. 14 is an eye diagram illustrating inter-symbol equalization. The eye diagram illustrated in FIG. 14 may correspond to the corrected signal (SHIN) provided to S/H 1390.

In FIG. 14, the output of integrator 1390 is ramping in voltage and the output of S/H 1390 tracks this ramp until the hold interval begins. During the hold interval, sampler 1315 evaluates the output of summer 1382 and the decision feedback is applied by summer 1382 to the held voltage being output by S/H 1390.

Figure 15:
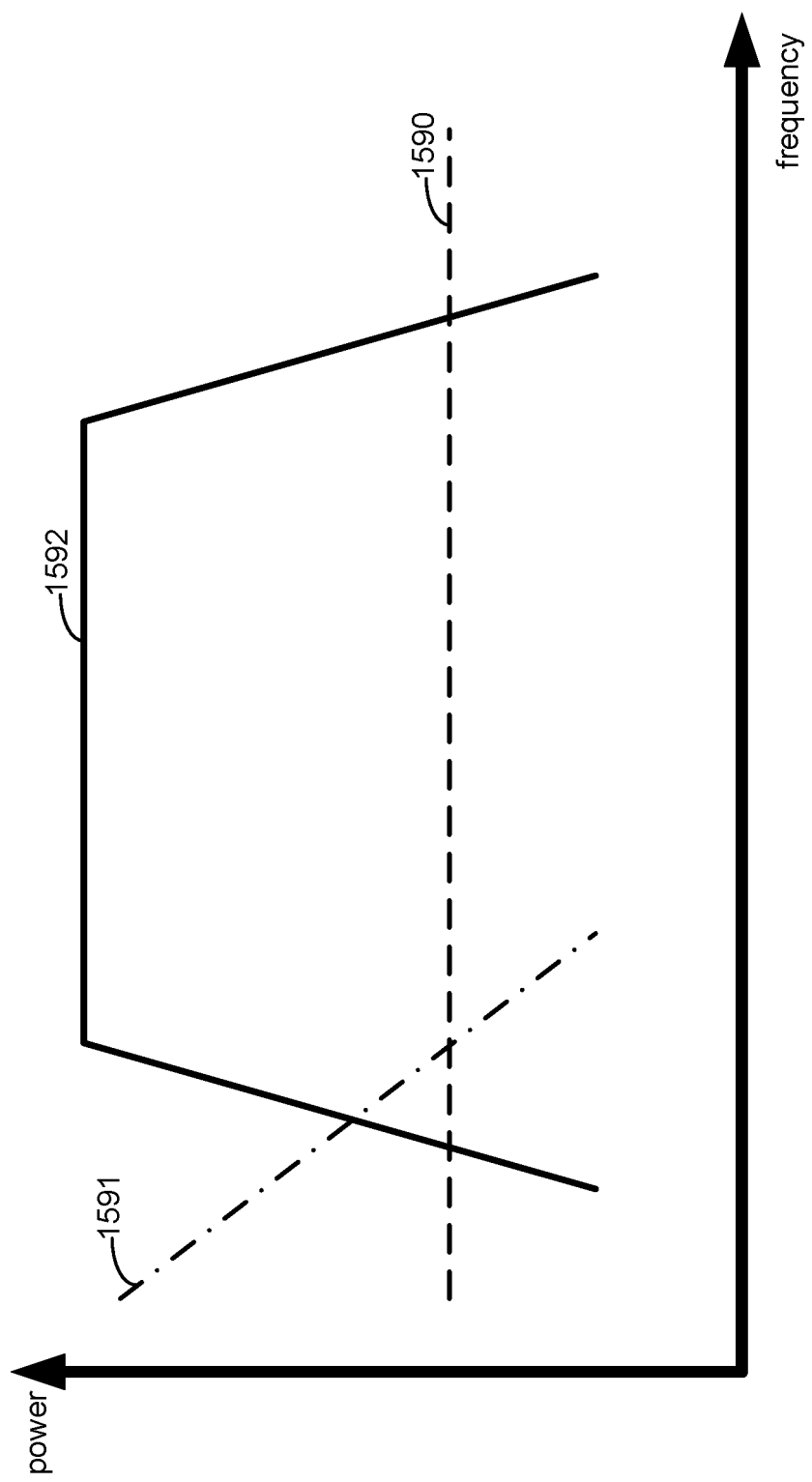
FIG. 15 is a diagram illustrating frequency dependent noise and a front-end filter characteristic.

FIG. 15 is a diagram illustrating frequency dependent noise and a front-end filter characteristic. In FIG. 15, white noise power is illustrated by line 1590 and 1/f noise power is illustrated by line 1591. A front-end band-pass filter characteristic 1592 that reduces or effectively removes 1/f noise at low frequencies, white noise at low frequencies, and white noise at high frequencies is illustrated. The frequency characteristic 1592 may be an example of the frequency characteristics of one or more of front-end 140, 240, 340, 440, 540, 640, 740, 840, 1140, and/or 1440.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of receiver 100, receiver 200, receiver 300, receiver 400, receiver 500, receiver 600, receiver 700, and/or receiver 800, receiver 1100, receiver 1300, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 16:
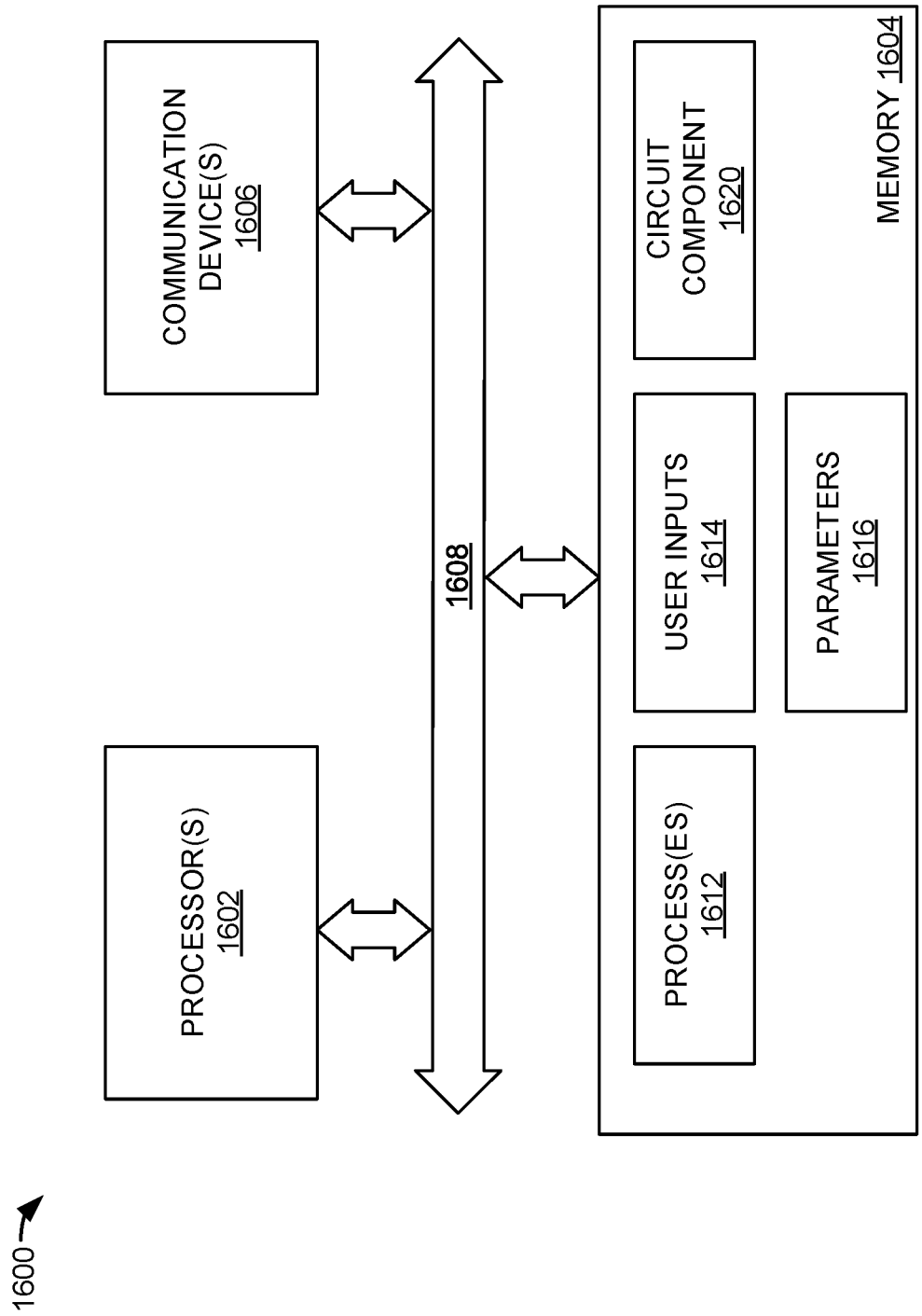
FIG. 16 is a block diagram of a processing system.

FIG. 16 is a block diagram illustrating one embodiment of a processing system 1600 for including, processing, or generating, a representation of a circuit component 1620. Processing system 1600 includes one or more processors 1602, a memory 1604, and one or more communications devices 1606. Processors 1602, memory 1604, and communications devices 1606 communicate using any suitable type, number, and/or configuration of wired and/or wireless connections 1608.

Processors 1602 execute instructions of one or more processes 1612 stored in a memory 1604 to process and/or generate circuit component 1620 responsive to user inputs 1614 and parameters 1616. Processes 1612 may be any suitable electronic design automation (EDA) tool or portion thereof used to design, simulate, analyze, and/or verify electronic circuitry and/or generate photomasks for electronic circuitry. Representation 1620 includes data that describes all or portions of receiver 100, receiver 200, receiver 300, receiver 400, receiver 500, receiver 600, receiver 700, receiver 800, receiver 1100, and/or receiver 1300, and their components, as shown in the Figures.

Representation 1620 may include one or more of behavioral, register transfer, logic component, transistor, and layout geometry-level descriptions. Moreover, representation 1620 may be stored on storage media or communicated by carrier waves.

Data formats in which representation 1620 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1614 may comprise input parameters from a keyboard, mouse, voice recognition interface, microphone and speakers, graphical display, touch screen, or other type of user interface device. This user interface may be distributed among multiple interface devices. Parameters 1616 may include specifications and/or characteristics that are input to help define representation 1620. For example, parameters 1616 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1604 includes any suitable type, number, and/or configuration of non-transitory computer-readable storage media that stores processes 1612, user inputs 1614, parameters 1616, and circuit component 1620.

Communications devices 1606 include any suitable type, number, and/or configuration of wired and/or wireless devices that transmit information from processing system 1600 to another processing or storage system (not shown) and/or receive information from another processing or storage system (not shown). For example, communications devices 1606 may transmit circuit component 1620 to another system. Communications devices 1606 may receive processes 1612, user inputs 1614, parameters 1616, and/or circuit component 1620 and cause processes 1612, user inputs 1614, parameters 1616, and/or circuit component 1620 to be stored in memory 1604.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   front-end circuitry to receive a signal during a current symbol time and to provide a bandwidth limited signal based on the signal;
   first integrator circuitry to receive the bandwidth limited signal and provide an integrator output signal;
   summer circuitry to receive the integrator output signal and to, based on a previous symbol sampler decision indicator, produce an equalized integrator output signal corresponding to a current symbol time; and,
   a first sampler to produce a current symbol sampler decision indicator based on the equalized integrator output signal corresponding to the current symbol time.

2. The integrated circuit of claim 1, comprising:
   a second sampler to produce the previous symbol sampler decision indicator based on the equalized integrator output signal corresponding to a previous symbol time.

3. The integrated circuit of claim 1, comprising:
   correction circuitry to receive a plurality of consecutive symbol sampler decisions and to, based on the plurality of consecutive symbol sampler decisions, reduce an error component in the bandwidth limited signal.

4. The integrated circuit of claim 3, wherein the error component comprises a low-frequency error that is based on a bandwidth limitation of the bandwidth limited signal.

5. The integrated circuit of claim 4, wherein the low-frequency error is caused by mismatches between a first number of first symbols received via the signal and a second number of second symbols received via the signal.

6. The integrated circuit of claim 5, wherein the correction circuitry comprises a digital integrator.

7. The integrated circuit of claim 6, wherein a digital integrator output is set to an initial value in response to a transition between a first symbol and a second symbol.

8. An integrated circuit, comprising:
   correction circuitry to reduce an error component in a bandwidth limited signal corresponding to a current symbol time based on a first plurality of consecutive symbol sampler decisions;
   filter circuitry to provide the bandwidth limited signal based on an input signal;
   integrator circuitry to receive the bandwidth limited signal and provide an integrator output signal;
   equalization circuitry to receive the integrator output signal and to, based on a previous symbol sampler decision indicator, produce an equalized integrator output signal corresponding to the current symbol time; and,
   a first sampler to produce a current symbol sampler decision indicator based on the equalized integrator output signal corresponding to the current symbol time, the current symbol sampler decision indicator to be included in a second plurality of consecutive symbol sampler decisions to reduce an error component in the bandwidth limited signal corresponding to at least one subsequent symbol time.

9. The integrated circuit of claim 8, comprising:
   a second sampler to produce the previous symbol sampler decision indicator based on the equalized integrator output signal corresponding to a previous symbol time.

10. The integrated circuit of claim 8, wherein the correction circuitry reduces a low-frequency error component in the bandwidth limited signal that is a result of a high-pass filter characteristic of the filter circuitry.

11. The integrated circuit of claim 8, wherein the correction circuitry reduces a low-frequency that is a result of mismatches between a first number of first symbols received via the signal and a second number of second symbols received via the signal.

12. The integrated circuit of claim 8, wherein the correction circuitry comprises second integrator circuitry.

13. The integrated circuit of claim 12, wherein the integrator circuitry accumulates the first plurality of consecutive symbol sampler decisions to produce an error correction indicator.

14. The integrated circuit of claim 13, wherein an error correction indicator output by the integrator circuitry is set to an initial value in response to a transition between a first symbol and a second symbol.

* * * * *